US012648184B2

(12) United States Patent
Tamaru et al.

(10) Patent No.: US 12,648,184 B2
(45) Date of Patent: Jun. 2, 2026

(54) SEMICONDUCTOR DEVICE

(71) Applicant: Magnolia White Corporation, Tokyo (JP)

(72) Inventors: Takaya Tamaru, Tokyo (JP); Masashi Tsubuku, Tokyo (JP); Toshinari Sasaki, Tokyo (JP); Hajime Watakabe, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 287 days.

(21) Appl. No.: 18/449,830

(22) Filed: Aug. 15, 2023

(65) Prior Publication Data

US 2023/0387322 A1     Nov. 30, 2023

Related U.S. Application Data

(63) Continuation of application No. PCT/JP2022/001713, filed on Jan. 19, 2022.

(30) Foreign Application Priority Data

Feb. 17, 2021     (JP) ................................. 2021-023751

(51) Int. Cl.
*H10D 64/62*        (2025.01)
*H10D 30/67*        (2025.01)
(Continued)

(52) U.S. Cl.
CPC ......... *H10D 30/6755* (2025.01); *H10D 64/01* (2025.01); *H10D 64/62* (2025.01); *H10K 59/1213* (2023.02)

(58) Field of Classification Search
CPC .... H10D 30/6755; H10D 64/01; H10D 64/62; H10D 86/471; H10D 86/423;
(Continued)

(56) References Cited

U.S. PATENT DOCUMENTS 9,876,119 B2 *  1/2018  Honda ............... H10D 30/6713
2011/0133180 A1   6/2011  Yamazaki
(Continued)

FOREIGN PATENT DOCUMENTS

JP        2011-142310 A      7/2011
JP        2012-134472 A      7/2012
(Continued)

OTHER PUBLICATIONS

International Search Report issued on Apr. 12, 2022 in corresponding application No. PCT/JP2022/001713; 4 pages.

*Primary Examiner* — Monica D Harrison
(74) *Attorney, Agent, or Firm* — Maier & Maier, PLLC

(57)        ABSTRACT

A semiconductor device including: an oxide semiconductor layer including a first surface and a second surface opposite to the first surface; a gate electrode facing the oxide semiconductor layer; a gate insulating layer between the oxide semiconductor layer and the gate electrode; and a pair of first electrode being in contact with the first surface of the oxide semiconductor layer, respectively, wherein the oxide semiconductor layer including a region in which composition ratio of nitrogen is 2 percent or more within a depth range of 2 nanometers from the first surface in a region vicinity of an edge of at least one of the first electrode of the pair of first electrode.

10 Claims, 35 Drawing Sheets

(51) Int. Cl.
    *H10D 64/01*        (2025.01)
    *H10K 59/121*     (2023.01)

(58) Field of Classification Search
    CPC .. H10D 84/0126; H10D 84/038; H10D 84/83;
                   H10D 86/60; H10K 59/1213
    USPC ......................................................... 257/43
    See application file for complete search history.

(56) References Cited

U.S. PATENT DOCUMENTS

| | | | |
|---|---|---|---|
| 2012/0132906 | A1 | 5/2012 | Yamazaki |
| 2013/0320332 | A1 | 12/2013 | Hondo et al. |
| 2014/0151686 | A1 | 6/2014 | Yamazaki et al. |
| 2019/0245090 | A1 | 8/2019 | Kusayanagi et al. |
| 2022/0013668 | A1 | 1/2022 | Toda et al. |

FOREIGN PATENT DOCUMENTS

| | | | |
|---|---|---|---|
| JP | 2014-007393 | A | 1/2014 |
| JP | 2018-022879 | A | 2/2018 |
| JP | 2018-078339 | A | 5/2018 |
| JP | 2020-167235 | A | 10/2020 |

* cited by examiner

10

149B
147B  } 140B
145B

130B

120B

880C

871C

870C

D1

D2

310D

SEMICONDUCTOR DEVICE

CROSS REFERENCE TO RELATED APPLICATIONS

This application is a Continuation of International Patent Application No. PCT/JP2022/001713, filed on Jan. 19, 2022, which claims the benefit of priority to Japanese Patent Application No. 2021-023751, filed on Feb. 17, 2021, the entire contents of which are incorporated herein by reference.

FIELD

An embodiment of the present invention is related to a semiconductor device. In particular, an embodiment of the present invention is related to a semiconductor device in which an oxide semiconductor is used as a channel.

BACKGROUND

In recent years, the development of a semiconductor device using an oxide semiconductor as a channel has been progressing (for example, Japanese Laid Open Patent Publication No. 2018-078339) in place of amorphous silicon, low-temperature polysilicon and single crystal silicon. The semiconductor device which uses an oxide semiconductor as a channel can be formed with a simple structure and at a low-temperature process similar to a semiconductor device which uses amorphous silicon as a channel. It is known that a semiconductor device which uses an oxide semiconductor as a channel has higher mobility than a semiconductor which device uses amorphous silicon as a channel. A semiconductor device which uses an oxide semiconductor as a channel is known to have a very low off current.

In order to stably operate for a semiconductor device which uses an oxide semiconductor, it is important to supply a large amount of oxygen to the oxide semiconductor in the manufacturing process and reduce oxygen vacancies which are formed in the oxide semiconductor. Japanese Laid Open Patent Application No. 2018-078339 discloses a technique for forming an insulating layer which covers an oxide semiconductor under a condition where the insulating layer includes a large amount of oxygen as one method for supplying oxygen to an oxide semiconductor.

However, an insulating layer formed under the condition where the insulating layer includes a large amount of oxygen will contain a lot of defects. This causes an abnormal characteristics of the semiconductor device or a characteristics fluctuation of the semiconductor device in a reliability test, which are thought to be aftereffects of electrons trapped in the defects. On the other hand, when an insulating layer with less defects is used, it is impossible to increase the oxygen contained in the insulating layer. Therefore, it is impossible to sufficiently provide oxygen from the insulating layer to the oxide semiconductor. Thus, it is required to achieve a manufacturing method of the semiconductor device and a structure of semiconductor device to improve reliability of the semiconductor device, even when the insulating layer which contains a large amount of oxygen is used as the insulating layer covering the oxide semiconductor.

SUMMARY

A semiconductor device according to an embodiment of the present invention including: an oxide semiconductor layer including a first surface and a second surface opposite to the first surface; a gate electrode facing the oxide semiconductor layer; a gate insulating layer between the oxide semiconductor layer and the gate electrode; and a pair of first electrode being in contact with the first surface of the oxide semiconductor layer, respectively. The oxide semiconductor layer including a region in which composition ratio of nitrogen is 2 percent or more within a depth range of 2 nanometers from the first surface in a region vicinity of an edge of at least one of the first electrode of the pair of first electrode.

3

Figure 18:
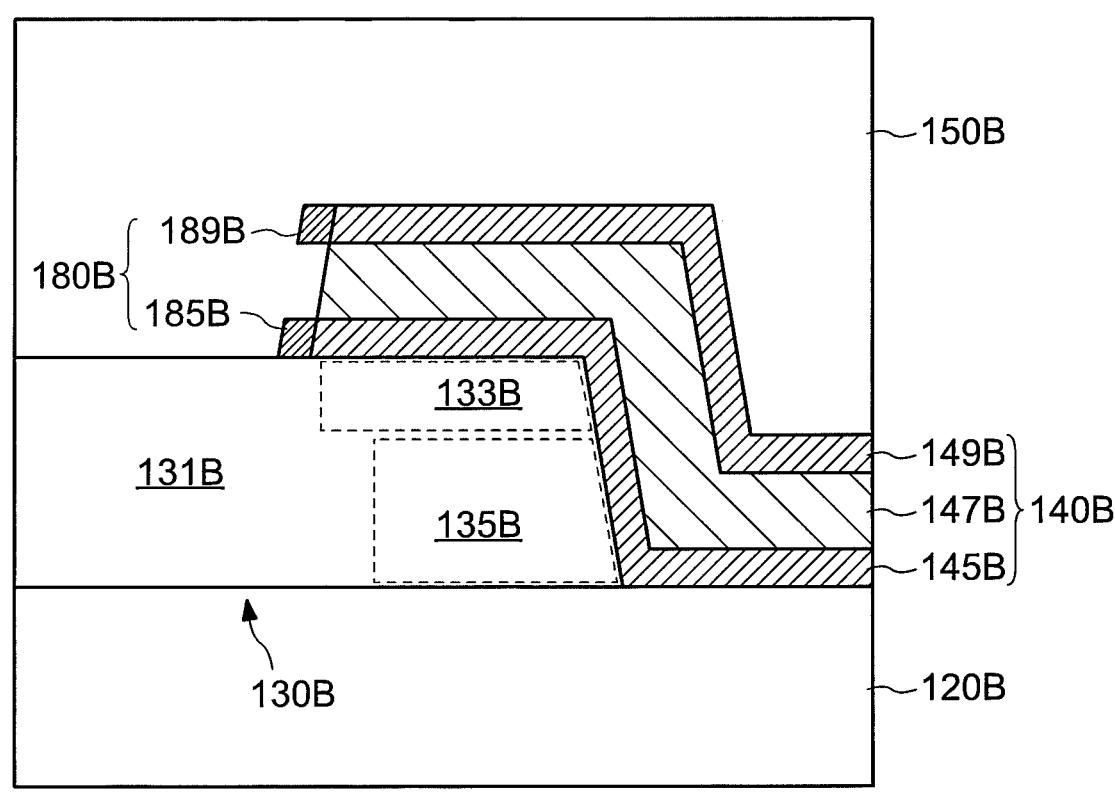

FIG. 18 is an enlarged cross-sectional view of a portion of a semiconductor device according to an embodiment of the present invention.

Figure 19:
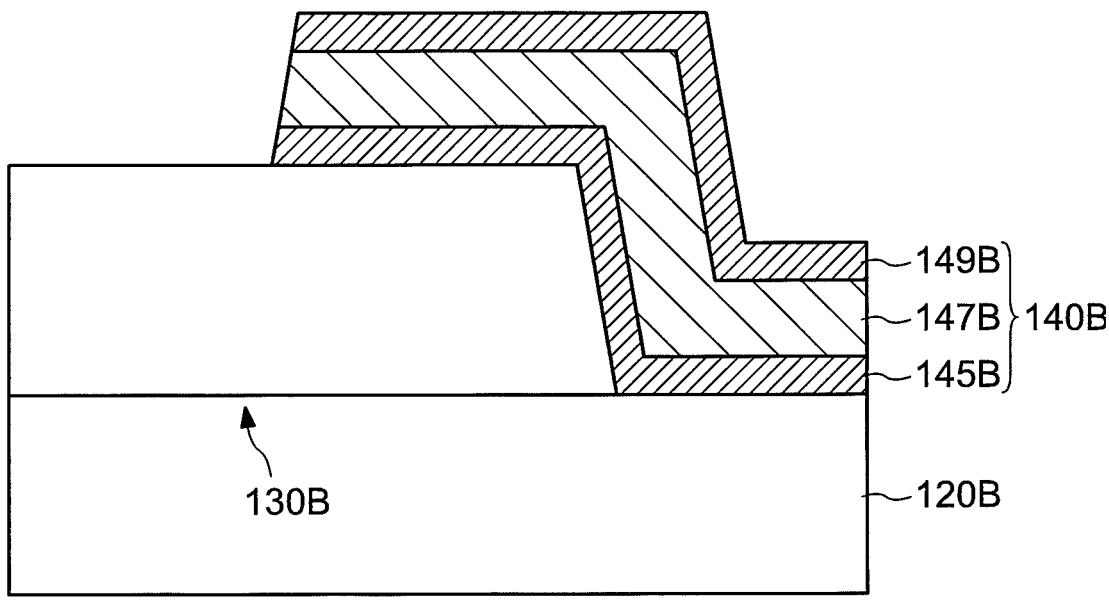

FIG. 19 is a cross-sectional view showing a manufacturing method of a semiconductor device according to an embodiment of the present invention.

Figure 20:
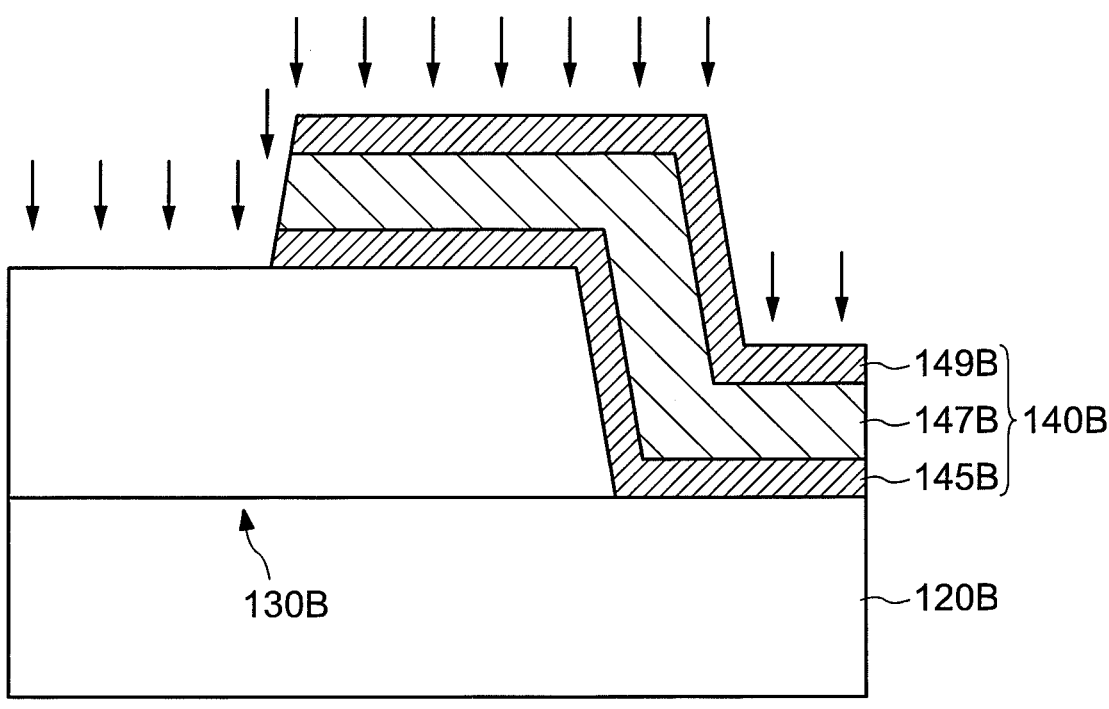

FIG. 20 is a cross-sectional view showing a manufacturing method of a semiconductor device according to an embodiment of the present invention.

Figure 21:
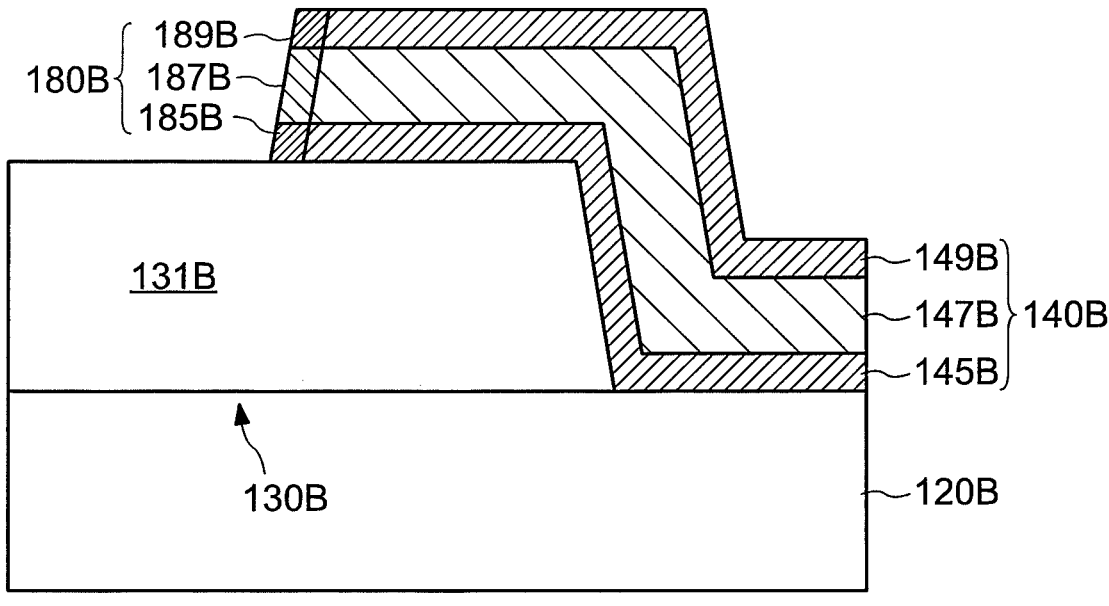

FIG. 21 is a cross-sectional view showing a manufacturing method of a semiconductor device according to an embodiment of the present invention.

Figure 22:
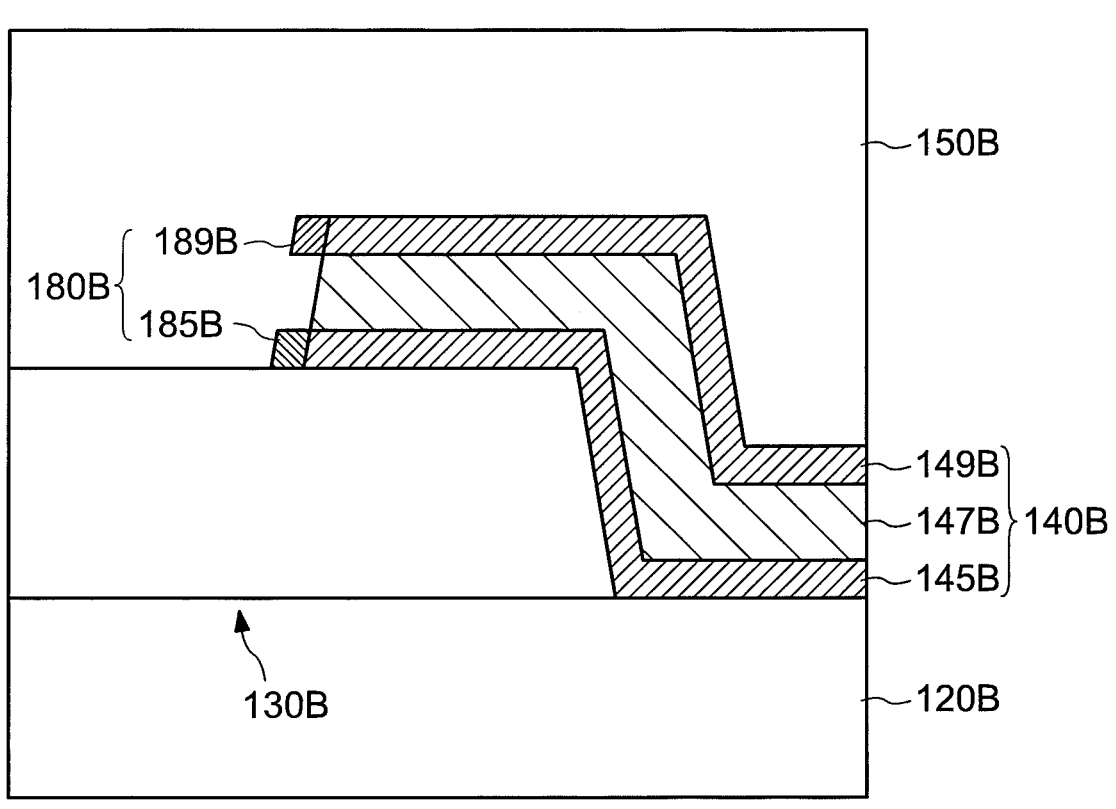

FIG. 22 is a cross-sectional view showing a manufacturing method of a semiconductor device according to an embodiment of the present invention.

Figure 23:
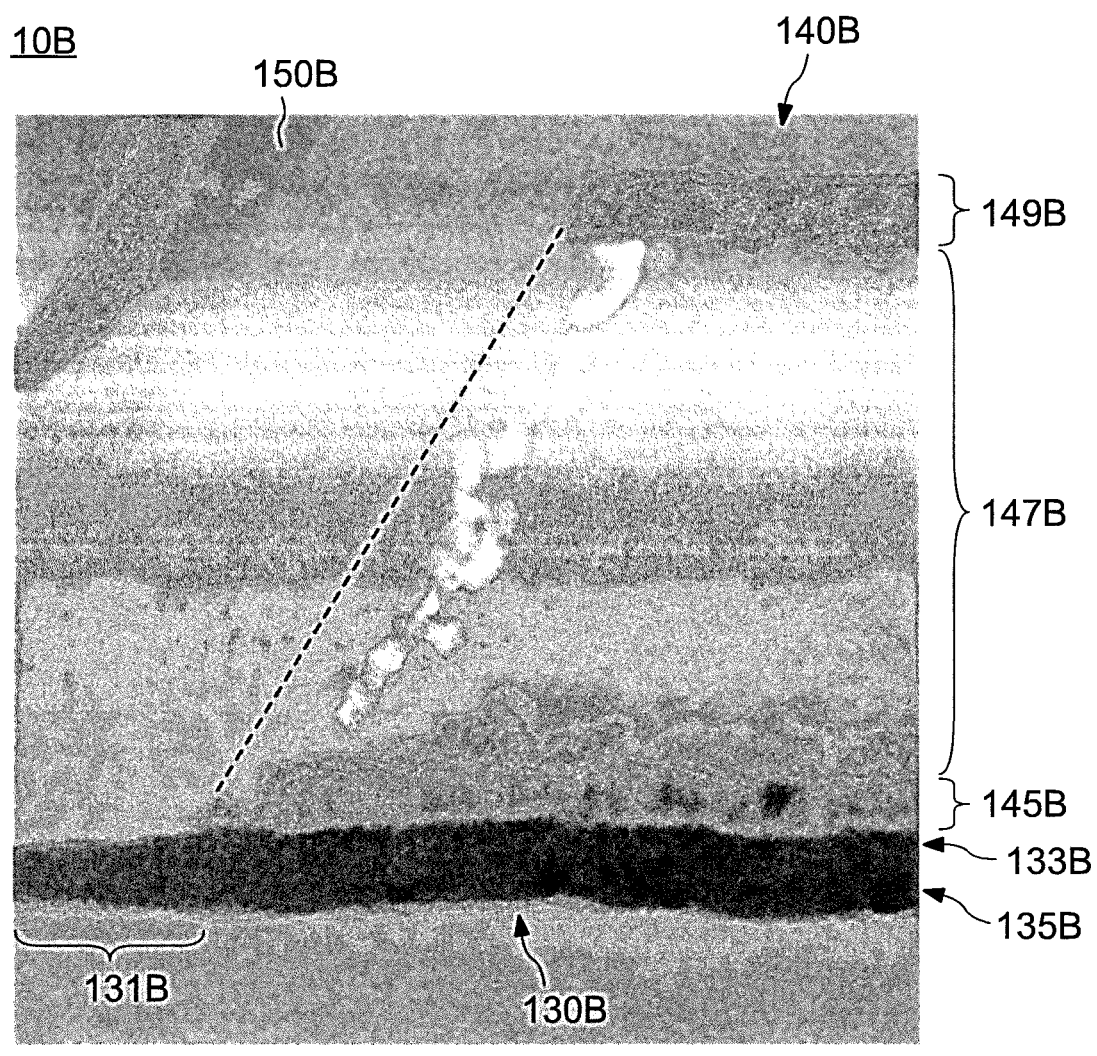

FIG. 23 is a cross-sectional TEM image of a semiconductor device according to an embodiment of the present invention.

Figure 24:
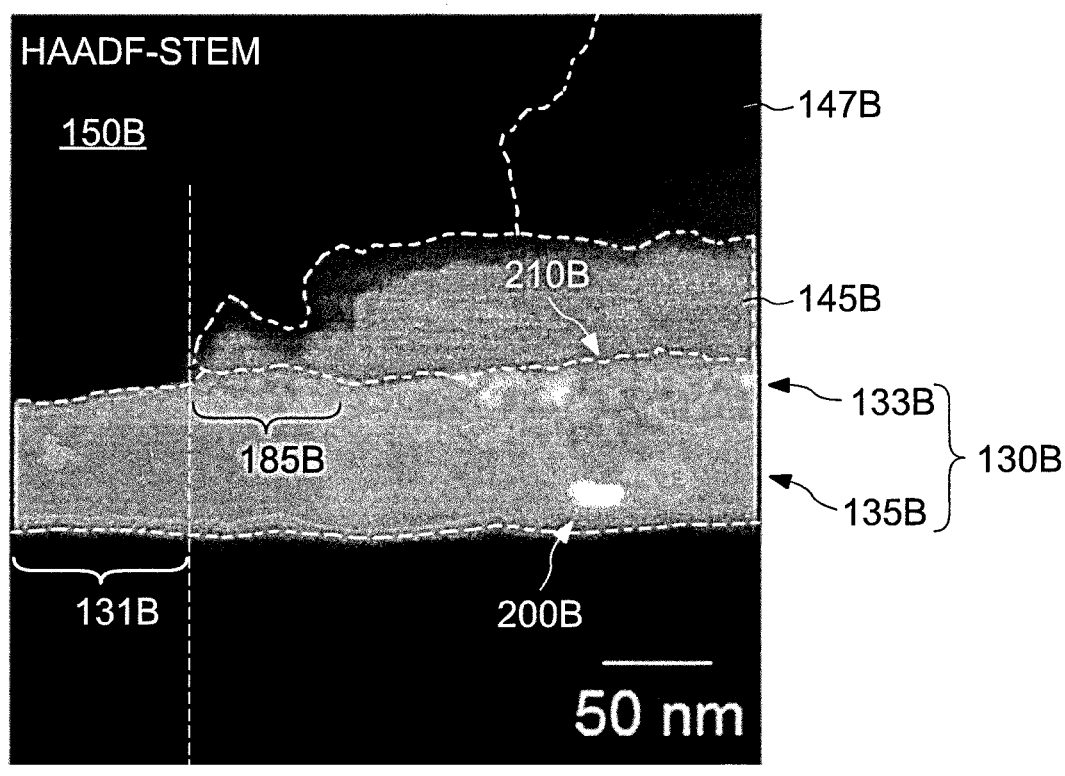

FIG. 24 is a cross-sectional HAADF-STEM image of a semiconductor device according to an embodiment of the present invention.

Figure 25:
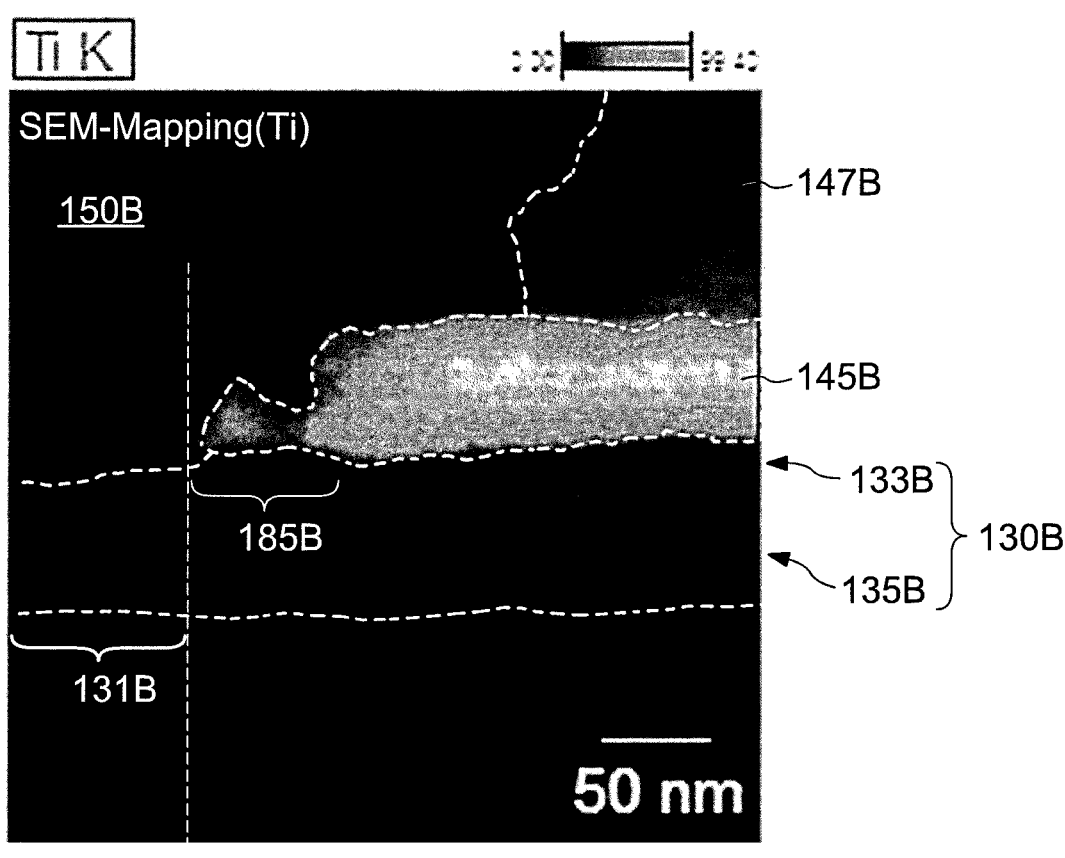

FIG. 25 is an EDX-mapping measurement result of a semiconductor device according to an embodiment of the present invention.

Figure 26:
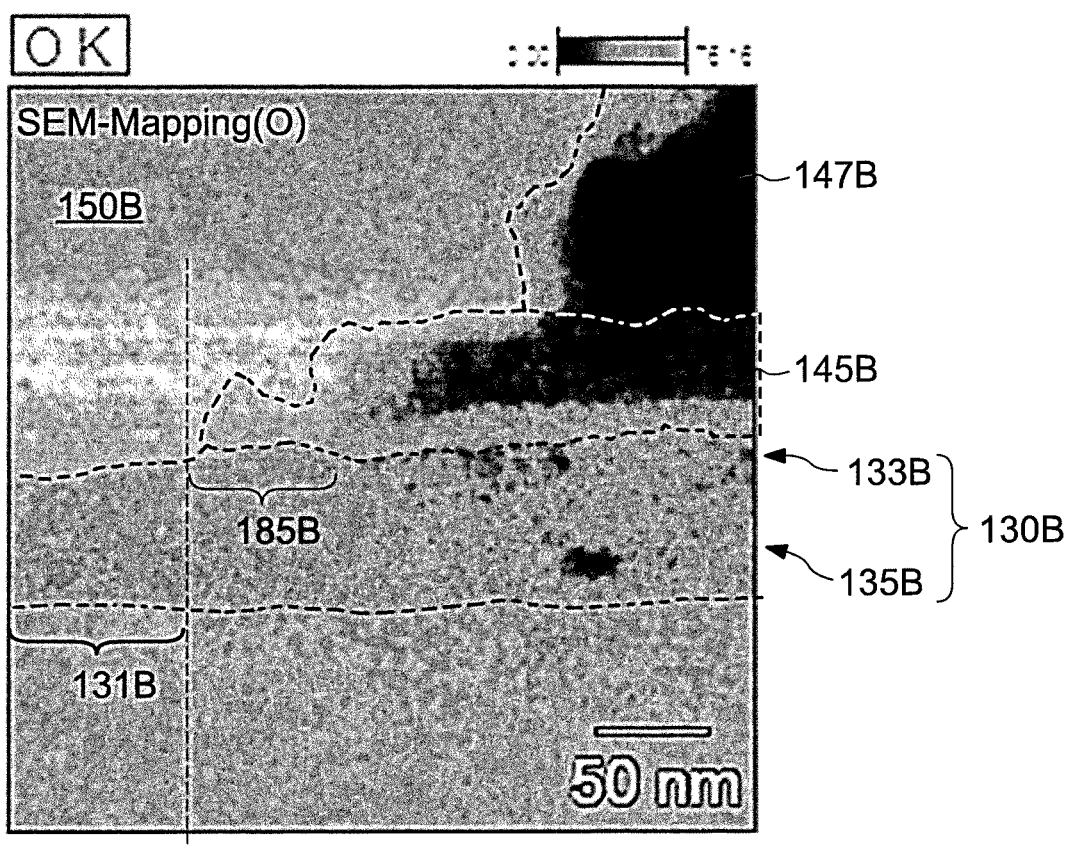

FIG. 26 is an EDX-mapping measurement result of a semiconductor device according to an embodiment of the present invention.

Figure 27:
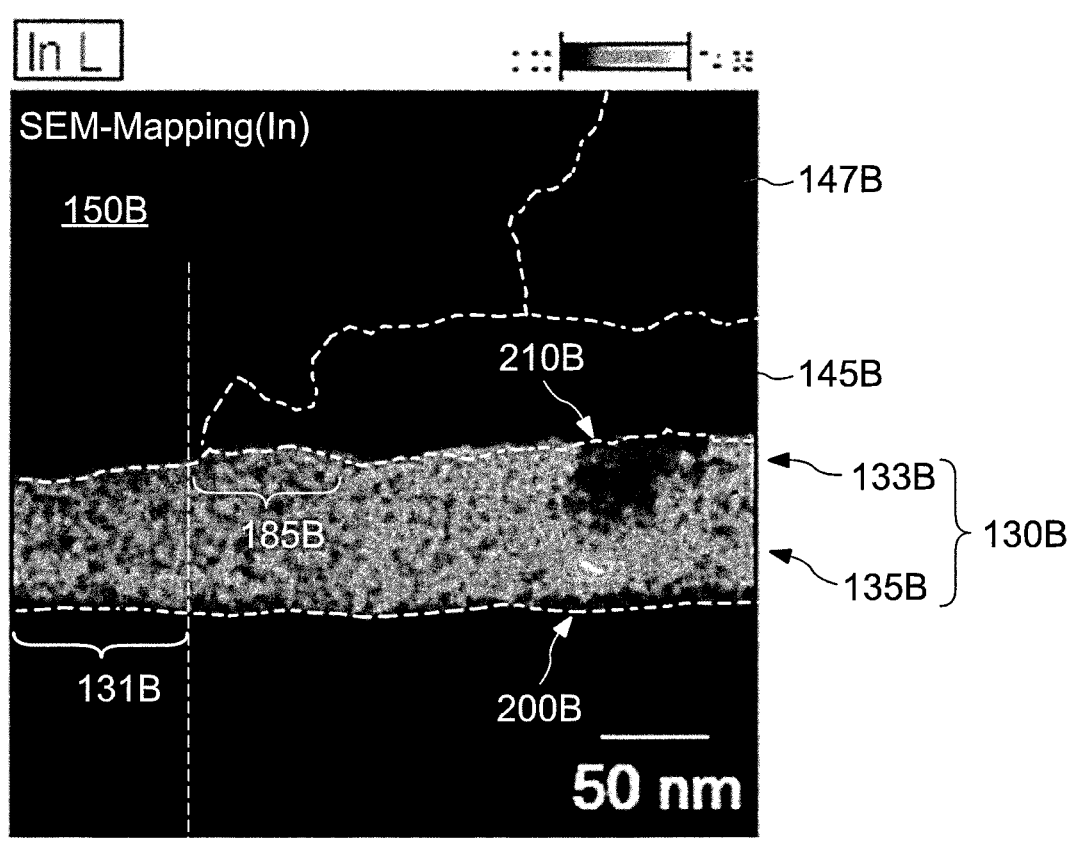

FIG. 27 is an EDX-mapping measurement result of a semiconductor device according to an embodiment of the present invention.

Figure 28:
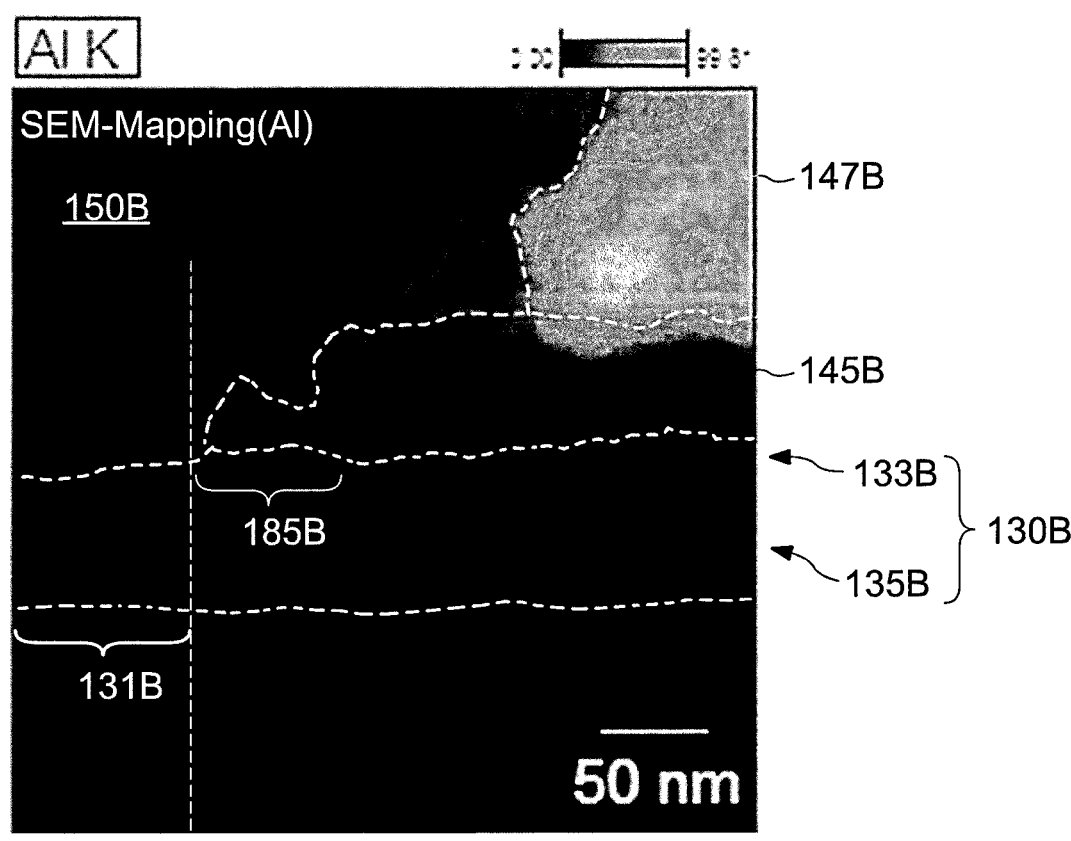

FIG. 28 is an EDX-mapping measurement result of a semiconductor device according to an embodiment of the present invention.

Figure 29:
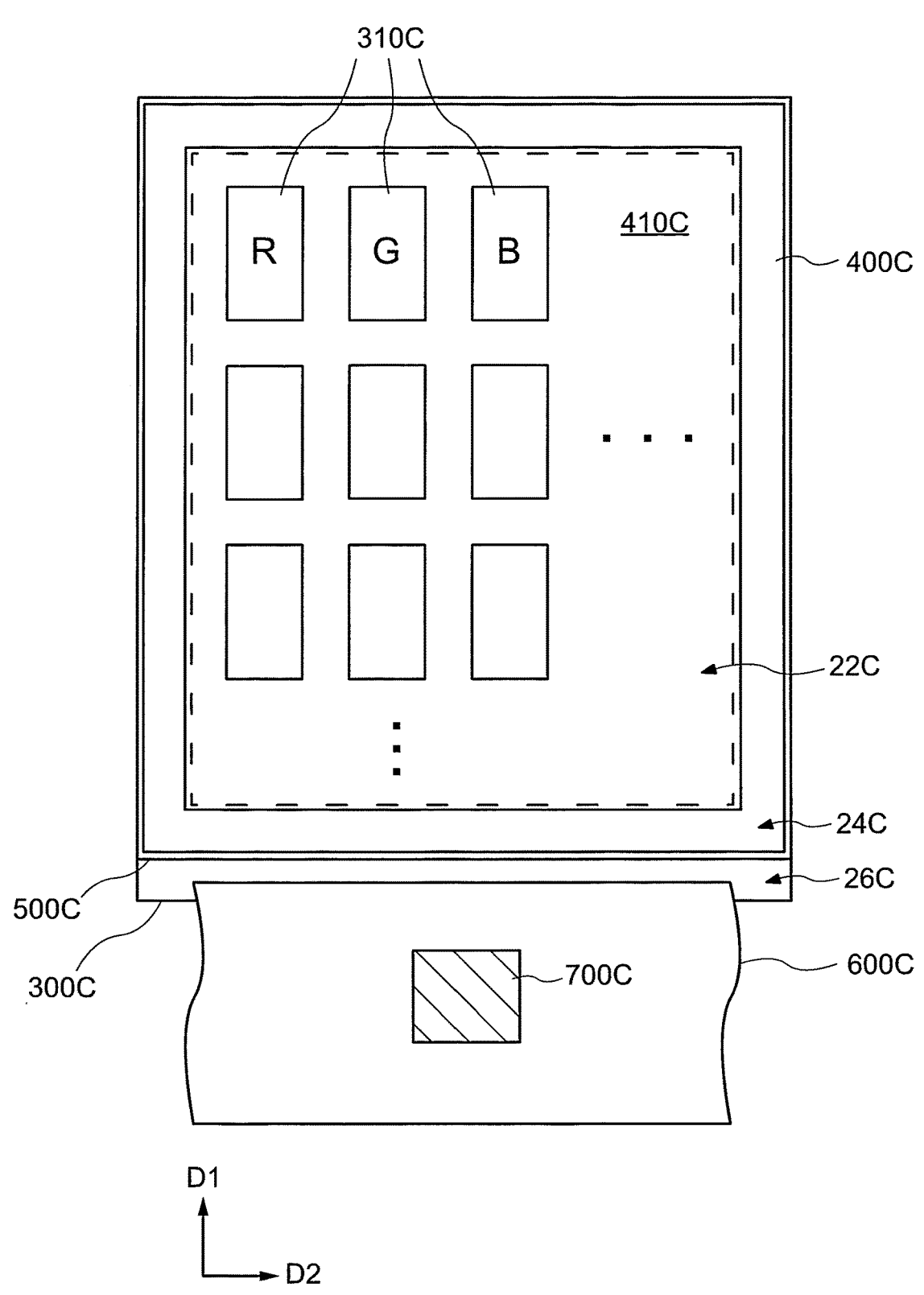

FIG. 29 is a plan view showing an outline of a display device according to an embodiment of the present invention.

Figure 30:
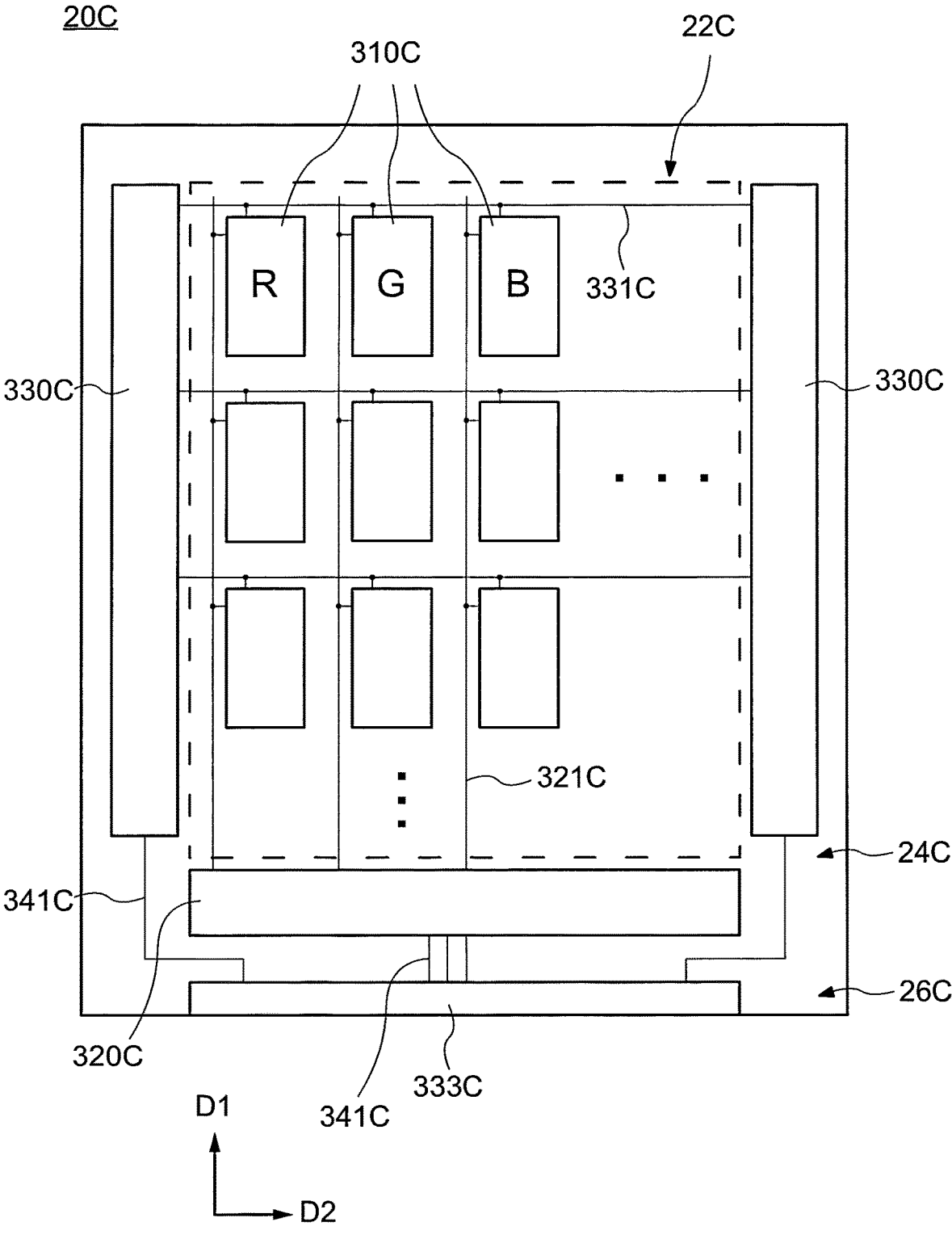

FIG. 30 is a block diagram showing a circuit configuration of a display device according to an embodiment of the present invention.

Figure 31:
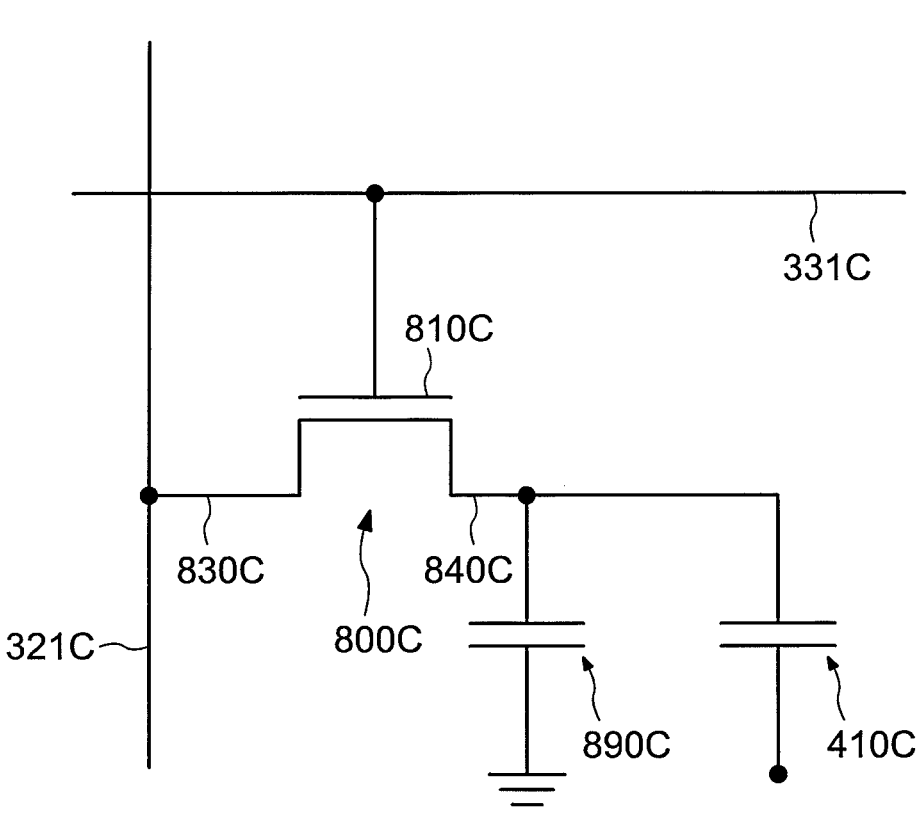

FIG. 31 is a circuit diagram showing a pixel circuit of a display device according to an embodiment of the present invention.

Figure 32:
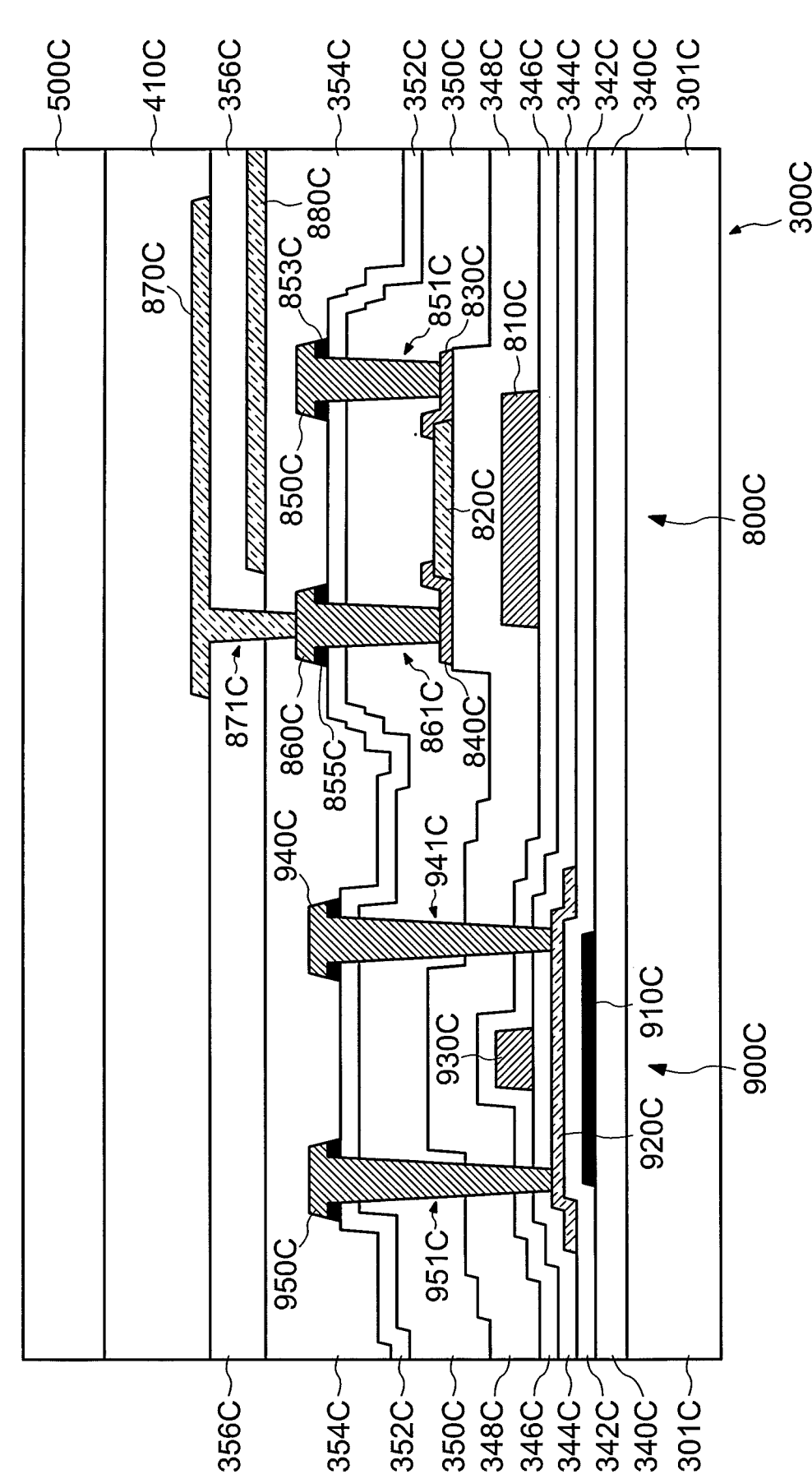

FIG. 32 is a cross-sectional view of a display device according to an embodiment of the present invention.

Figure 33:
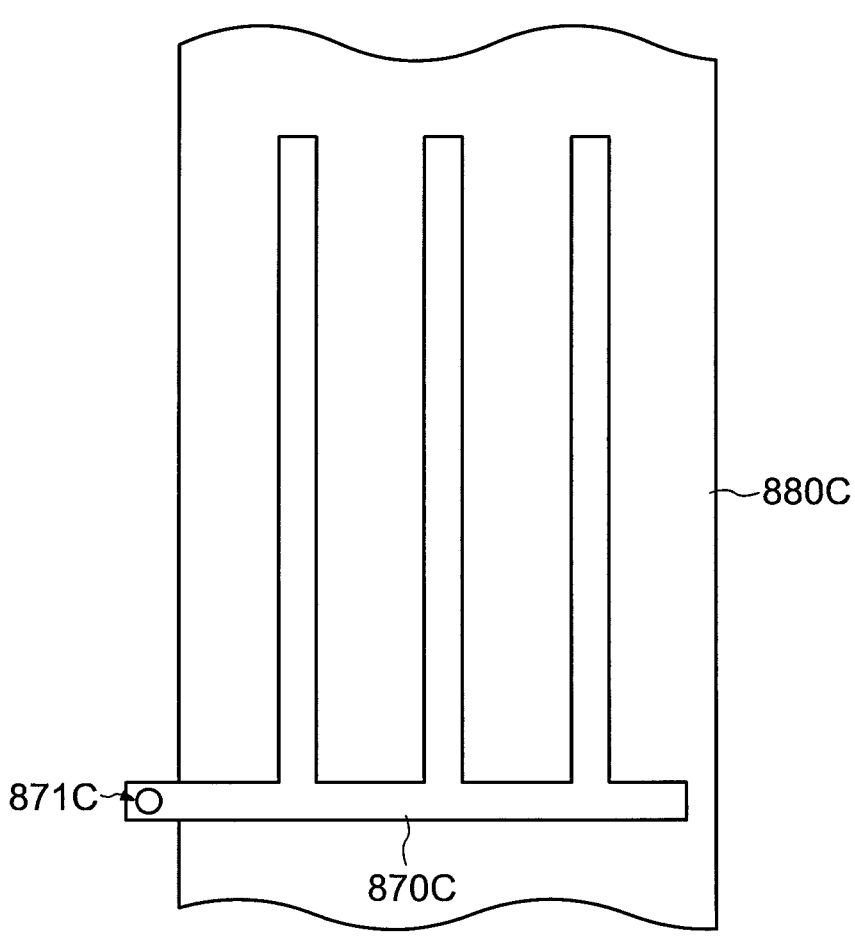
Figure 33:
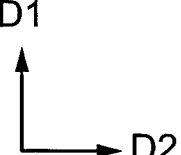

FIG. 33 is a plan view of a pixel electrode and a common electrode of a display device according to an embodiment of the present invention.

Figure 34:
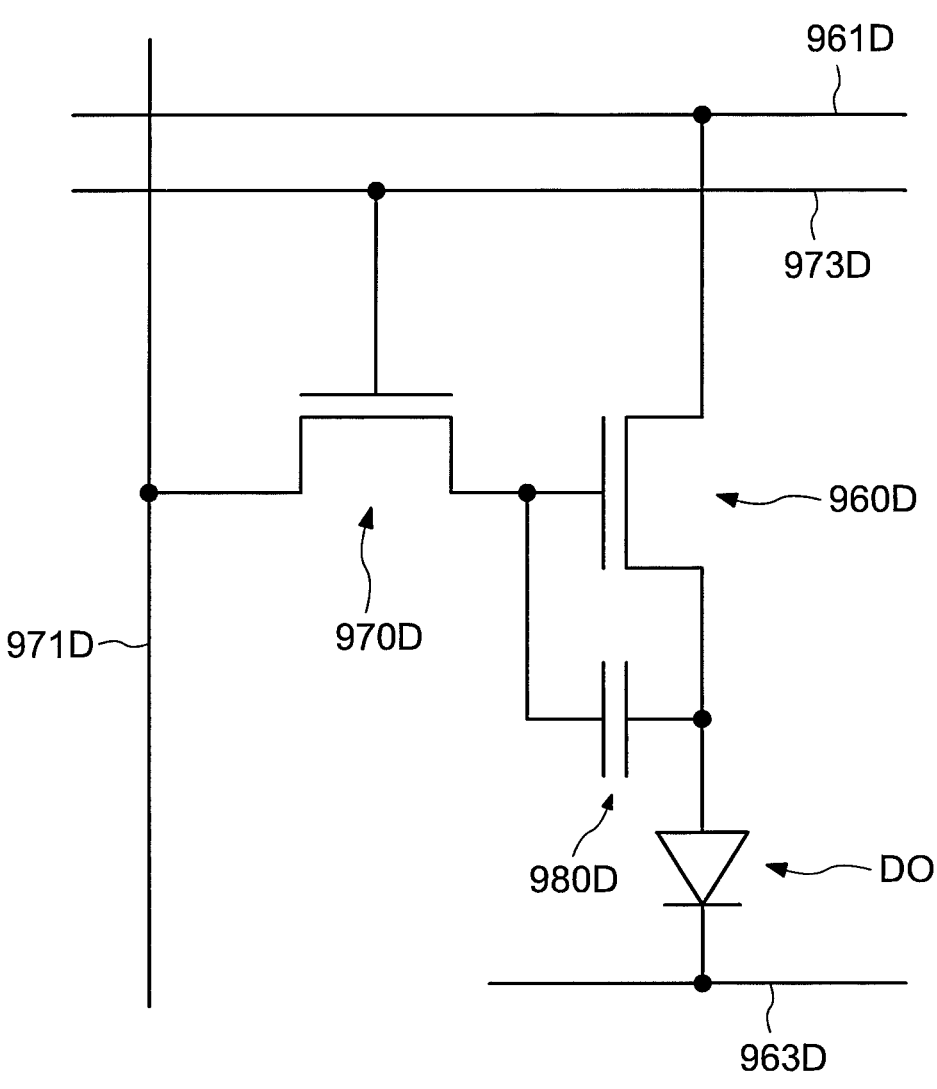

FIG. 34 is a circuit diagram showing a pixel circuit of a display device according to an embodiment of the present invention.

Figure 35:
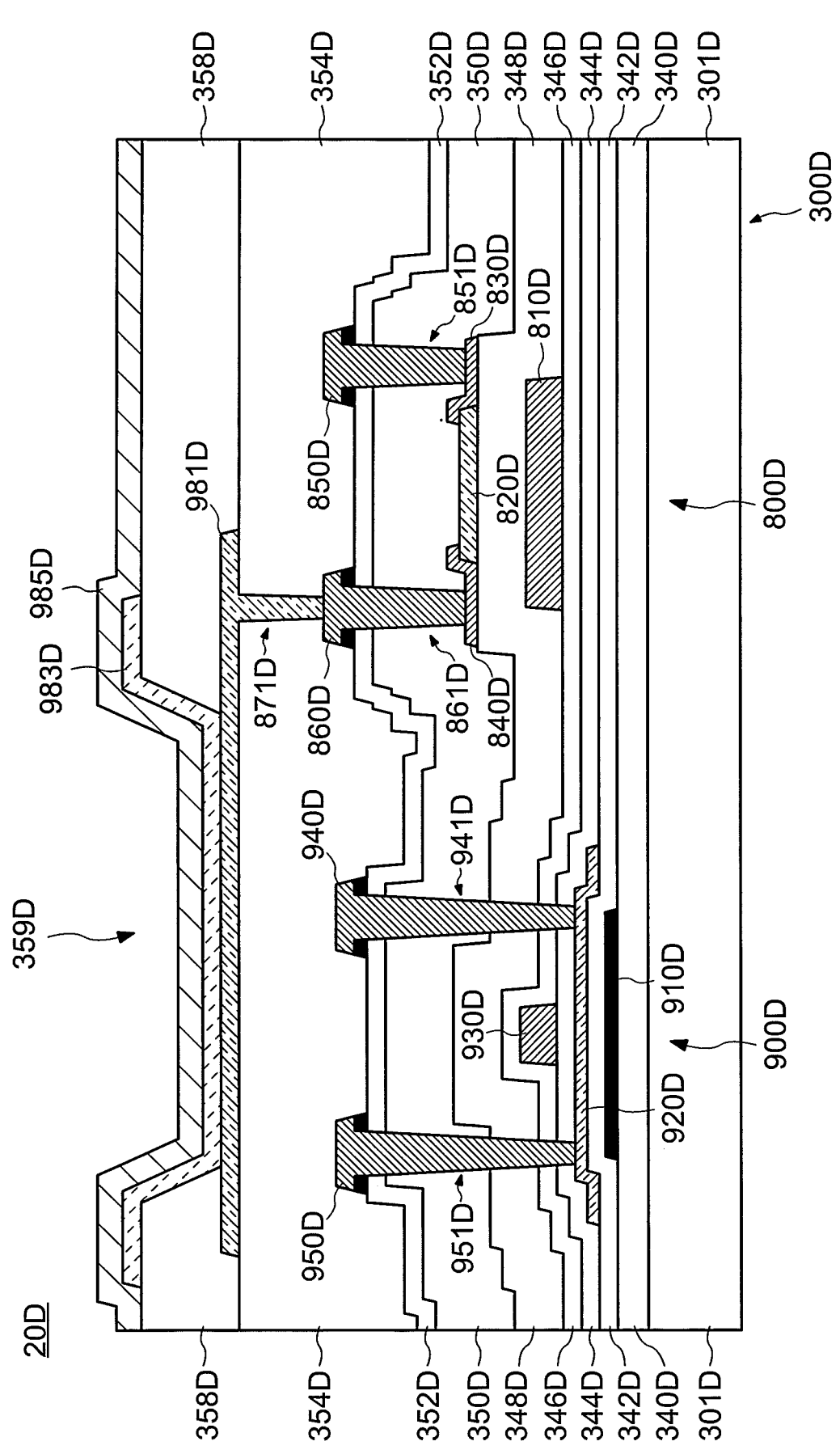

FIG. 35 is a cross-sectional view of a display device according to an embodiment of the present invention.

DESCRIPTION OF EMBODIMENTS

Each embodiment of the present invention is explained below while referring to the drawings. However, the disclosure herein is only an example and a structure easily arrived at by a person skilled in the art by making appropriate modifications without departing from the concept of the invention is naturally to be contained in the scope of the present invention. The drawings may be schematically represented with the width, thickness, shape and the like of each portion as compared with the actual form in order to clarify the explanation more clearly. However, they are only an example and do not limit an interpretation of the present invention. In the specification and drawings, elements having the same functions as those described with reference to preceding figures are attached with a letter of the alphabet after the same reference symbol and a detailed explanation may be omitted as appropriate.

In each embodiment of the present invention, a direction from a substrate towards an oxide semiconductor layer is referred to as "on" or "above". Conversely, a direction from the semiconductor layer towards the substrate is referred to as "under" or "below". As described above, for the convenience of explanation, although an explanation is made using the terms "above" or "below", for example, the vertical relationship between the substrate and the semiconductor layer may be reversed. In the explanation below, for example, the expression "semiconductor layer on the substrate" merely describes the vertical relationship between the substrate and the semiconductor layer as described above, other members may also be arranged between the substrate and the semiconductor layer. Above or below means the stacking order in a structure in which a plurality of layers is stacked, and in the case where a pixel electrode is expressed as above a transistor, it may be a positional relationship in which the transistor and the pixel electrode do not overlap in a plan view. On the other hand, when a pixel electrode is expressed vertically above a transistor, it means a positional relationship in which the transistor and the pixel electrode overlap in a plan view.

"Display device" refers to a structure that displays an image using an electro-optic layer. For example, the term "display device" may refer to a display panel including an electro-optical layer, or a structure in which another optical member (for example, a polarizing member, a backlight, a touch panel, or the like) is attached to a display cell. The "electro-optic layer" may include a liquid crystal layer, an electroluminescence (EL) layer, an electrochromic (EC) layer, and an electrophoretic layer as long as no technical contradiction occurs. Therefore, the embodiments described later will be described by exemplifying a liquid crystal display device including a liquid crystal layer and an organic EL display device including an organic EL layer as a display device. The present invention can be applied to a display device including the electro-optic layer mentioned above.

In the present specification, the expressions "a includes A, B or C", "a includes any of A, B and C", and "a includes one selected from the group consisting of A, B and C" unless otherwise stated does not exclude the case where a includes a plurality of combinations of A to C. Furthermore, these expressions do not exclude the case where a includes other elements.

Furthermore, each of the following embodiments can be combined with each other as long as no technical contradiction occurs.

One of the subjects in an embodiment of the present invention is to achieve a highly reliable semiconductor device.

First Embodiment

A semiconductor device and a manufacturing method of the semiconductor device according to an embodiment of the present invention is explained using FIG. 1 to FIG. 13. The semiconductor device of the embodiments shown herein may also use an integrated circuit (IC) such as a microprocessing unit (MPU) or a memory circuit in addition to a semiconductor device such as a transistor used in a display device.

Structure of Semiconductor Device 10

Figure 1:
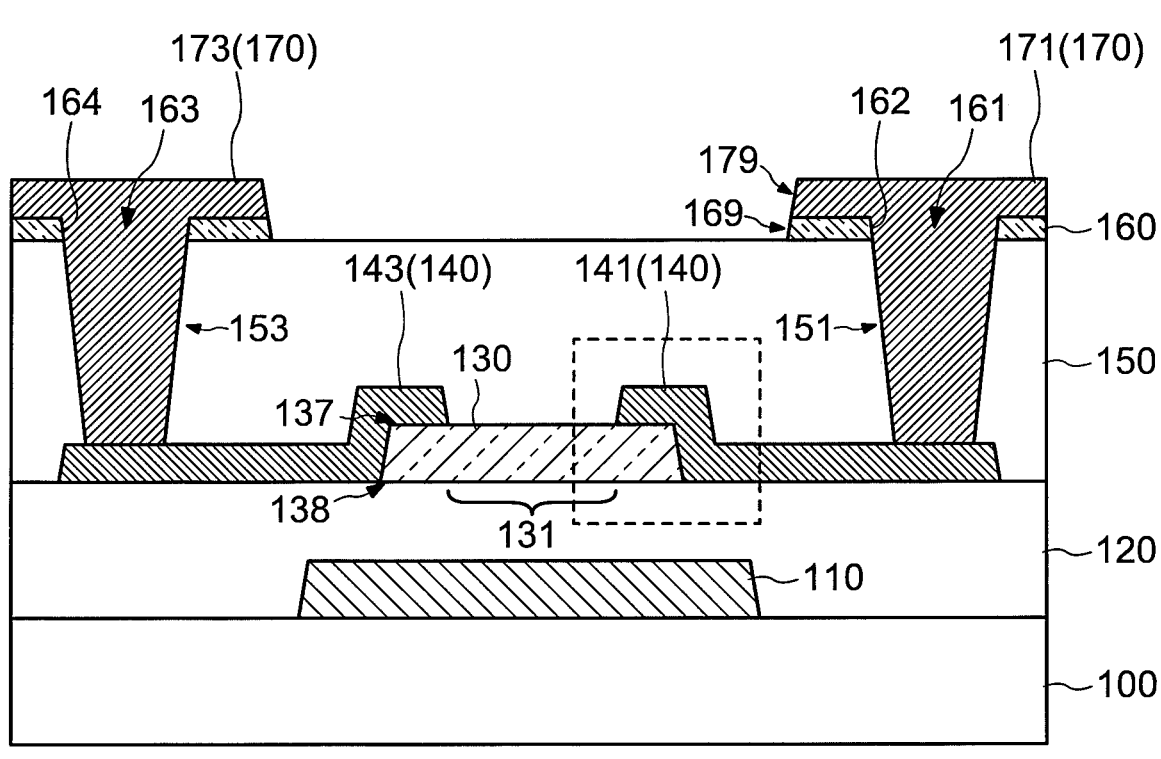
FIG. 1 is a cross-sectional view showing an outline of a semiconductor device according to an embodiment of the present invention.
Figure 2:
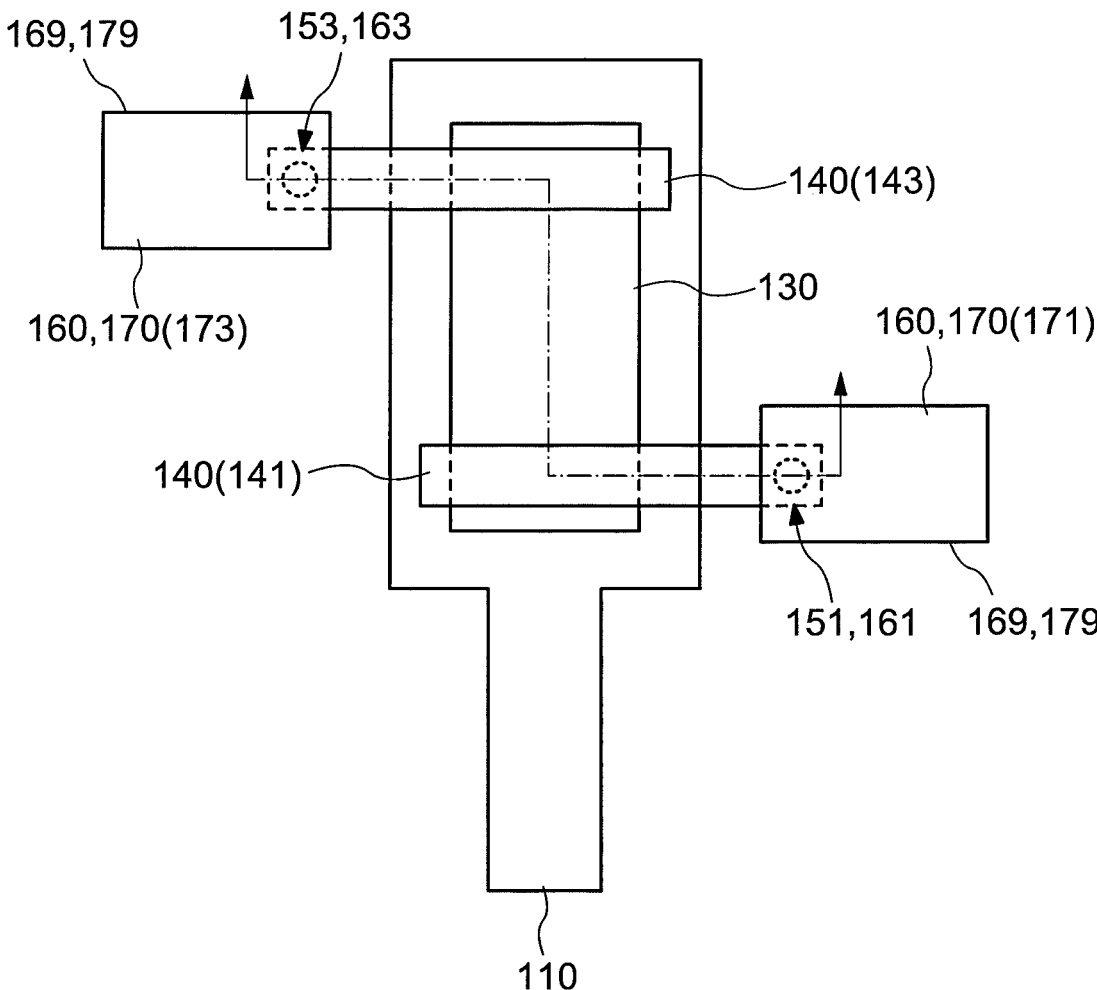
FIG. 2 is a plan view showing an outline of a semiconductor device according to an embodiment of the present invention.
Figure 3:
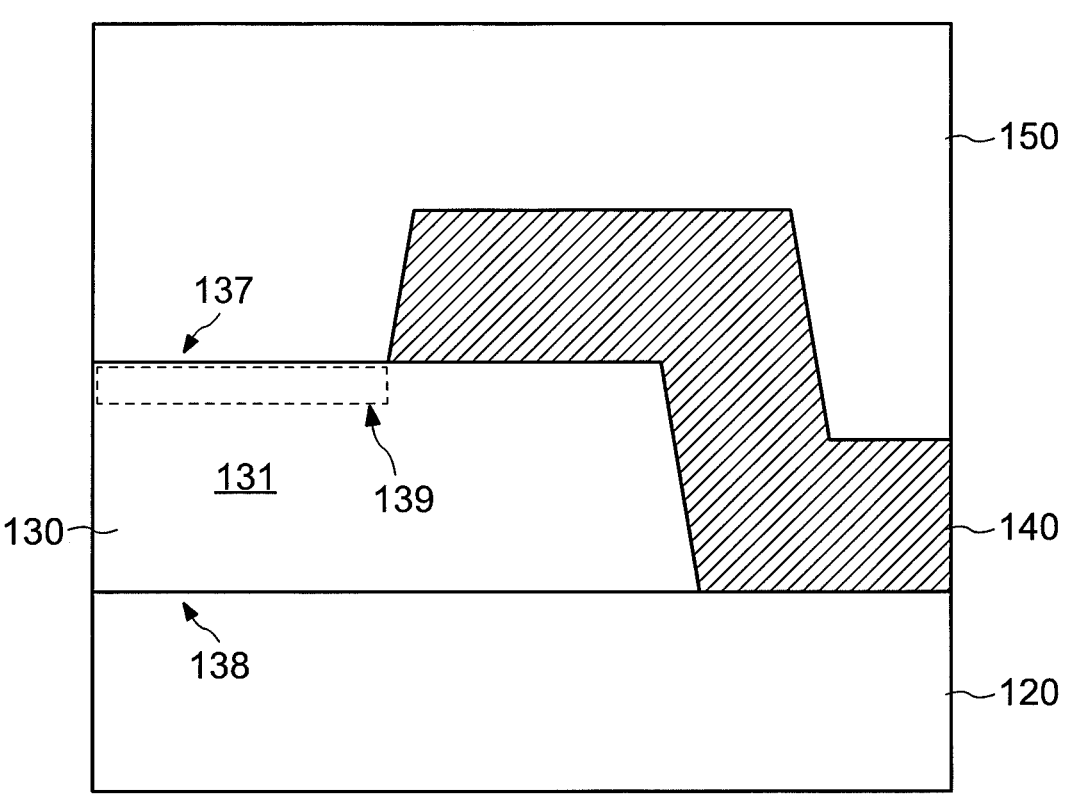
FIG. 3 is a partially enlarged cross-sectional view of a semiconductor device according to an embodiment of the present invention.

The structure of a semiconductor device 10 according to an embodiment of the present invention is explained using FIG. 1 to FIG. 3. FIG. 1 is a cross-sectional view showing an outline of a semiconductor device according to an embodiment of the present invention. FIG. 2 is a plan view showing an outline of the semiconductor device according to an embodiment of the present invention. FIG. 3 is a partially enlarged cross-sectional view of the semiconductor device according to an embodiment of the present invention.

As is shown in FIG. 1, the semiconductor device 10 is arranged above the substrate 100. The semiconductor device 10 includes a first gate electrode 110, a first gate insulating layer 120, a first oxide semiconductor layer 130, a first source electrode 141, a first drain electrode 143, a first insulating layer 150, an oxide layer 160, a first source wiring 171 and a first drain wiring 173. In the case where the first source electrode 141 and the first drain electrode 143 are not particularly distinguished, these electrodes may be referred to as a pair of first electrode 140 or a first electrode 140. In the following description, when referring to the first electrode 140, unless otherwise specified, it refers to the pair of first electrodes 140. In the case where the first source wiring 171 and the first drain wiring 173 are not particularly distinguished, these wirings may be referred to as the first conductive layer 170.

The first gate electrode 110 is arranged on the substrate 100. The first gate electrode 110 faces the first oxide semiconductor layer 130. The first gate insulating layer 120 is arranged between the first gate electrode 110 and the first oxide semiconductor layer 130. In the example of FIG. 1, the first gate electrode 110 and the first gate insulating layer 120 are arranged under the first oxide semiconductor layer 130. The first electrode 140 is arranged on the first gate insulating layer 120 and above the first oxide semiconductor layer 130. The first electrode 140 extends from the upper surface of the first gate insulating layer 120 to a pattern end of the first oxide semiconductor layer 130 and continues to the upper surface of the first oxide semiconductor layer 130. That is, the first electrode 140 is in contact with the first oxide semiconductor layer 130 from above the first oxide semiconductor layer 130. An upper surface of the first oxide semiconductor layer 130 can be referred as a first surface 137. A lower surface of the first oxide semiconductor layer 130 can be referred as a second surface 138. In this case, it can be referred that the first electrode 140 is in contact with the first surface 137 of the first oxide semiconductor layer 130.

The first oxide semiconductor layer 130 includes a channel region 131 between the first source electrode 141 and the first drain electrode 143. The first oxide semiconductor layer 130 in the channel region 131 is exposed from the first source electrode 141 and the first drain electrode 143. That is, at an end portion of the channel region 131, each of the first source electrode 141 and the first drain electrode 143 is in contact with the first oxide semiconductor layer 130.

The first insulating layer 150 covers the first oxide semiconductor layer 130 and the first electrode 140. Specifically, the first insulating layer 150 covers the first surface 137 of the first oxide semiconductor layer 130 sandwiched by the pair of the first electrode 140. A first aperture 151 and a first aperture 153 are arranged in the first insulating layer 150. The first aperture 151 is an opening which reaches the first source electrode 141. The first aperture 153 is an opening which reaches the first drain electrode 143. The oxide layer 160 is arranged on the first insulating layer 150. The second apertures 161 and 163 are arranged in the oxide layer 160. The second aperture 161 is an opening which is continuous with the first aperture 151. The second aperture 163 is an opening which is continuous with the first aperture 153.

A first conductive layer 170 is arranged on the oxide 160 and inside the first apertures 151, 153. In a plan view, the first conductive layer 170 is arranged in the same region as the oxide layer 160, except the region where the first apertures 151, 153 exist. That is, in a plan view, the oxide layer 160 does not exist in a region where the first conductive layer 170 does not exist, and the first insulating layer 150 is exposed from the oxide layer 160. The first conductive layer 170 is in contact with the first electrode 140 at the bottom of the first apertures 151, 153. The first wiring 170 is electrically connected to the first oxide semiconductor layer 130 via the first electrode 140.

In the present embodiment, an example of a configuration in which a bottom gate transistor configured with the gate electrode arranged below the oxide semiconductor layer is used as the semiconductor device 10, but the embodiment is not limited to this configuration. For example, a top gate transistor configured with the gate electrode arranged on the oxide semiconductor layer or a dual gate transistor configured with the gate electrodes arranged both above and below the oxide semiconductor layer may be used as the semiconductor device 10.

As is shown in FIG. 2, the first oxide semiconductor layer 130 is arranged inside the first gate electrode 110 in a plan view. In particular, the first oxide semiconductor layer 130 is arranged inside the first gate electrode 110 in a region where the channel of the semiconductor device 10 is formed. In other words, the outer edge of the pattern of the first oxide semiconductor layer 130 is surrounded by the outer edge of the pattern of the first gate electrode 110 in a plan view. The first electrode 140 crosses the first oxide semiconductor layer 130 in a plan view. In other words, the first electrode 140 intersects the first oxide semiconductor layer 130. The second aperture 161 overlaps the first aperture 151 in a plan view. The second aperture 163 overlaps the first aperture 153 in a plan view. The structure described above is merely one embodiment, and the present invention is not limited to the structure described above.

FIG. 3 is an enlarged view of a region surrounded by a dotted line frame in FIG. 1. As shown in FIG. 3, a nitrogen-containing region 139 is present in the vicinity of the upper surface of the first oxide semiconductor layer 130 in the channel region 131 (the surface of the first oxide semiconductor layer 130 facing the first insulating layer 150). The nitrogen-containing region 139 is present within 2 nanometers, within 3 nanometers, or within 5 nanometers in a depth direction from the upper surface of the first oxide semiconductor layer 130. The nitrogen-containing region 139 contains nitrogen in addition to the main component elements of the first oxide semiconductor layer 130. The composition ratio of nitrogen in the nitrogen-containing region 139 is 2 percent or more, 4 percent or more, or 6 percent or more.

Although details will be described later, the first oxide semiconductor layer 130 has a region where the composition ratio of nitrogen is 2 percent or more in the depth direction from the upper surface (the first surface 137) of the first oxide semiconductor layer 130 in the region near an end portion of at least one of the pair of first electrodes 140 (particularly, the first source electrode 141 side). With this configuration, the reliability of the semiconductor device 10 can be improved. In the present embodiment, the end portion of the channel region 131 on the side of the first electrode 140 and the end portion of the first electrode 140 on the side of the channel region 131 are located at substantially the same position, but are not limited to this configuration. For example, the channel region 131 and the first electrode 140 may be separated from each other.

Method of Introducing Nitrogen into Nitrogen-Containing Region 139

Examples of a method of introducing nitrogen into the nitrogen-containing region 139 includes a method of performing plasma treatment with the upper surface of the first oxide semiconductor layer 130 exposed. The first gate electrode 110, the first gate insulating layer 120, the first oxide semiconductor layer 130, and the first electrode 140 are formed on the substrate 100, and the first electrode 140 is etched to expose the first oxide semiconductor layer 130 in the channel region 131. The surface of the first oxide semiconductor layer 130 exposed from the first electrode 140 is subjected to a plasma treatment using a nitrogen-containing gas, whereby nitrogen is introduced into the vicinity of the surface of the first oxide semiconductor layer 130. For example, the nitrogen-containing region 139 is formed by performing plasma treatment using an $N_2O$ gas as the plasma treatment (hereinafter referred to as "$N_2O$ plasma treatment"). Controlling the duration of $N_2O$ plasma-treatment determines the composition ratio of nitrogen in the nitrogen-containing region 139.

About Nitrogen-Containing Region 139

Figure 4:
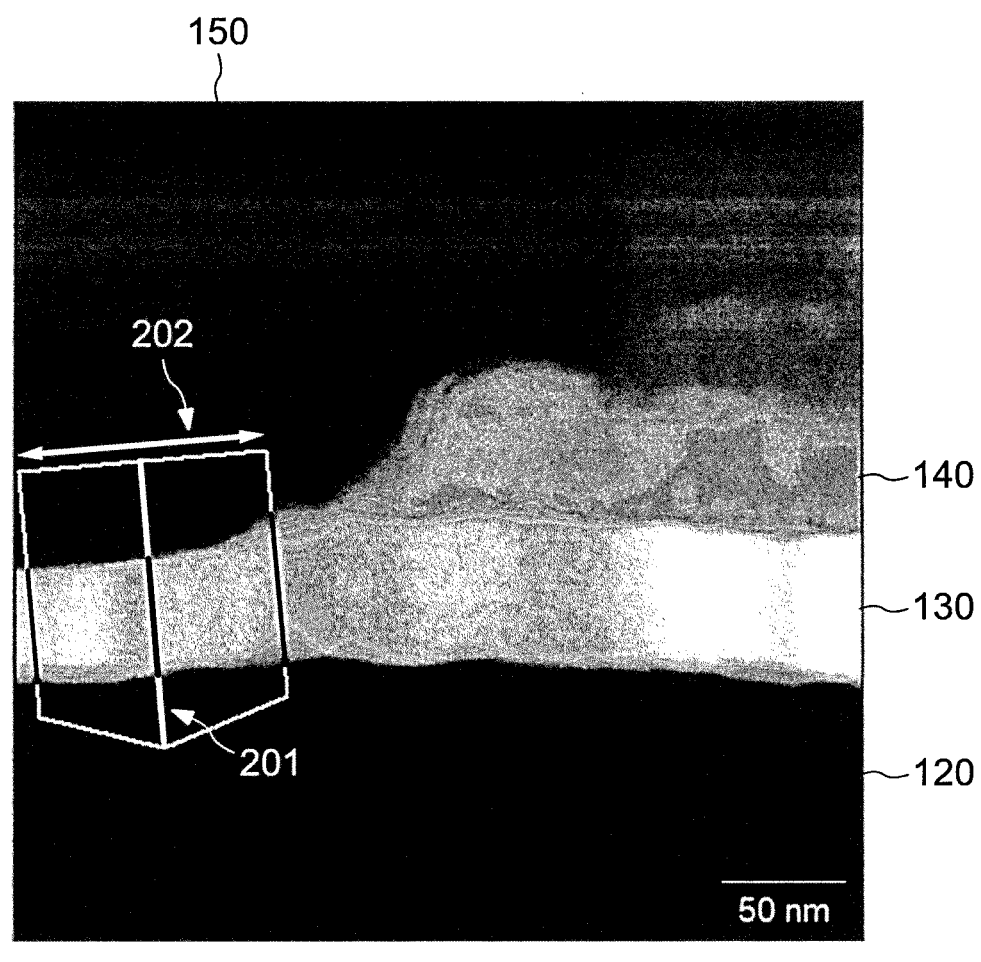
FIG. 4 is a cross-sectional STEM image of a semiconductor device according to an embodiment of the present invention.

The effects of the nitrogen-containing region 139 and nitrogen contained in the region on the semiconductor device 10 will be described with reference to FIG. 4 to FIG. 17. FIG. 4 is a cross-sectional STEM (Scanning Transmission Electron Microscope) image according to an embodiment of the present invention. In the STEM image of FIG. 4, the first gate insulating layer 120 and the first insulating layer 150 are shown in black, the first oxide semiconductor layer 130 is shown in white, and the first electrode 140 are shown in gray.

Analysis Method for Nitrogen-Containing Region 139

The composition analysis of the nitrogen-containing region 139 is executed by an EDX (Energy Dispersive X-ray spectrometry) arranged in STEM. For example, for the STEM image shown in FIG. 4, 256-point EDX analyses are performed vertically and horizontally. The composition ratio of the region specified by a specified line 201 and a line extraction width 202 shown below is calculated based on the EDX spectrum data obtained by the EDX spectrometry.

In the present embodiment, a device and measurement conditions used for STEM observation and EDX analysis of the nitrogen-containing region 139 are as follows. The following device and conditions are merely examples, and the present invention is not limited to those observed and analyzed in the following device and conditions.

[STEM Observations]
Device: JEOL JEM-ARM200F
Condition: Accelerating voltage 200 kV
Magnification accuracy 10%
[EDX Analysis]
Device: JEOL JEM-ARM200F
Condition: Accelerating voltage 200 kV
Beam diameter about 0.2 nmφ
Elemental analyzer JED-2300T
X-ray detector Si drift detector
Energy resolution about 140 eV
X-ray extraction angle 21.9°
Solid angle 0.98 sr
Captured pixel count 256×256

The calculation of the composition ratio is performed for each point of the specified line 201 of FIG. 4. In the calculation performed at each point of the specified line 201, EDX spectrum data in the range specified by the line extraction width 202 are integrated. The following analysis results are the results measured to include the first insulating layer 150, the first oxide semiconductor layer 130, and the first gate insulating layer 120, as shown in FIG. 4.

Analysis Result of Region 139Z in Comparative Example

A result of the composition analysis of the oxide semiconductor layer of the semiconductor device of Comparative Example will be described with reference to FIG. and FIG. 6. A configuration of a semiconductor device 10Z is substantially the same as the configuration of the semiconductor device 10 according to the present embodiment. Therefore, the configuration of the semiconductor device 10Z will be described with reference to FIG. 1. However, in order to distinguish them from each other, the reference signs of the respective configurations in the comparative example are denoted by reference signs with the addition of "Z" after the reference signs of the respective configurations in the present embodiment. Although details will be described later, in the comparative example, the nitrogen-containing region is not formed on the upper surface of a first oxide semiconductor layer 130Z. Therefore, in the comparative example, the same region as that of the nitrogen-containing region 139 of the present embodiment is referred to as a region 139Z.

Figure 5:
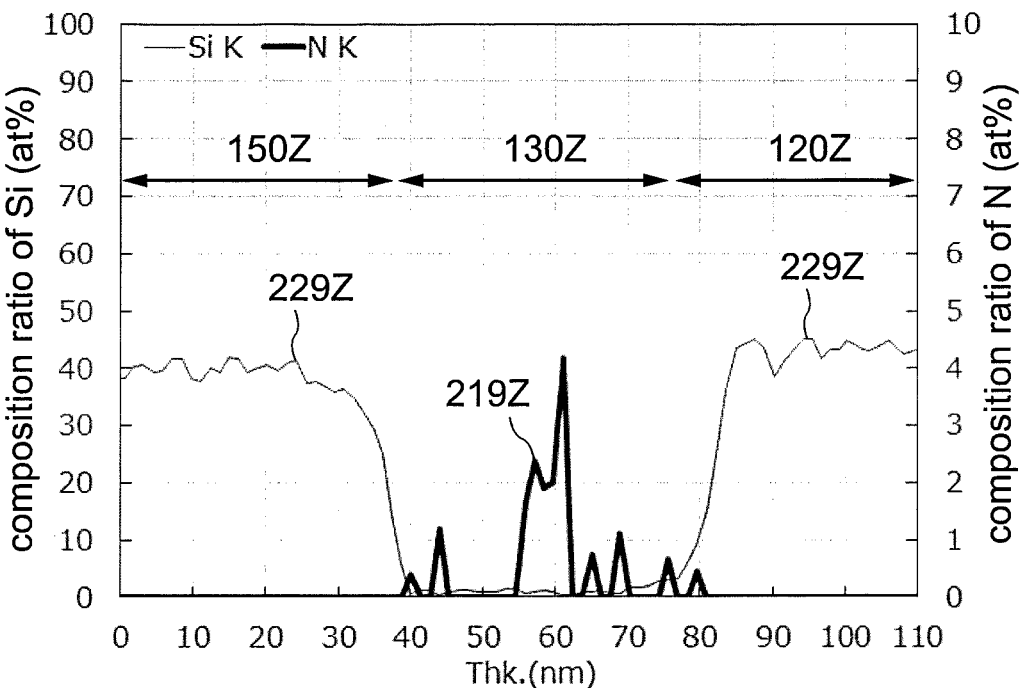
FIG. 5 is a diagram showing a result of composition analysis of a semiconductor device of Comparative Example.

FIG. 5 is a diagram showing a result of composition analysis of a semiconductor device of Comparative Example. FIG. 6 is an enlarged view of a vicinity of a boundary between a first insulating layer 150Z and the first oxide semiconductor layer 130Z of FIG. 5. The horizontal axis ("Thk.") of FIG. 5 and FIG. 6 indicates the position of the specified line 201 in the thickness direction. The vertical axis in FIG. 5 and FIG. 6 indicates the composition ratio of silicon (vertical axis on the left) or the composition ratio of nitrogen (vertical axis on the right). Two types of spectrum are displayed in FIG. 5 and FIG. 6, a spectrum 219Z indicated by a relatively thick line is a spectrum indicating a composition ratio of nitrogen, and a spectrum 229Z is a spectrum indicating a composition ratio of silicon.

Figure 6:
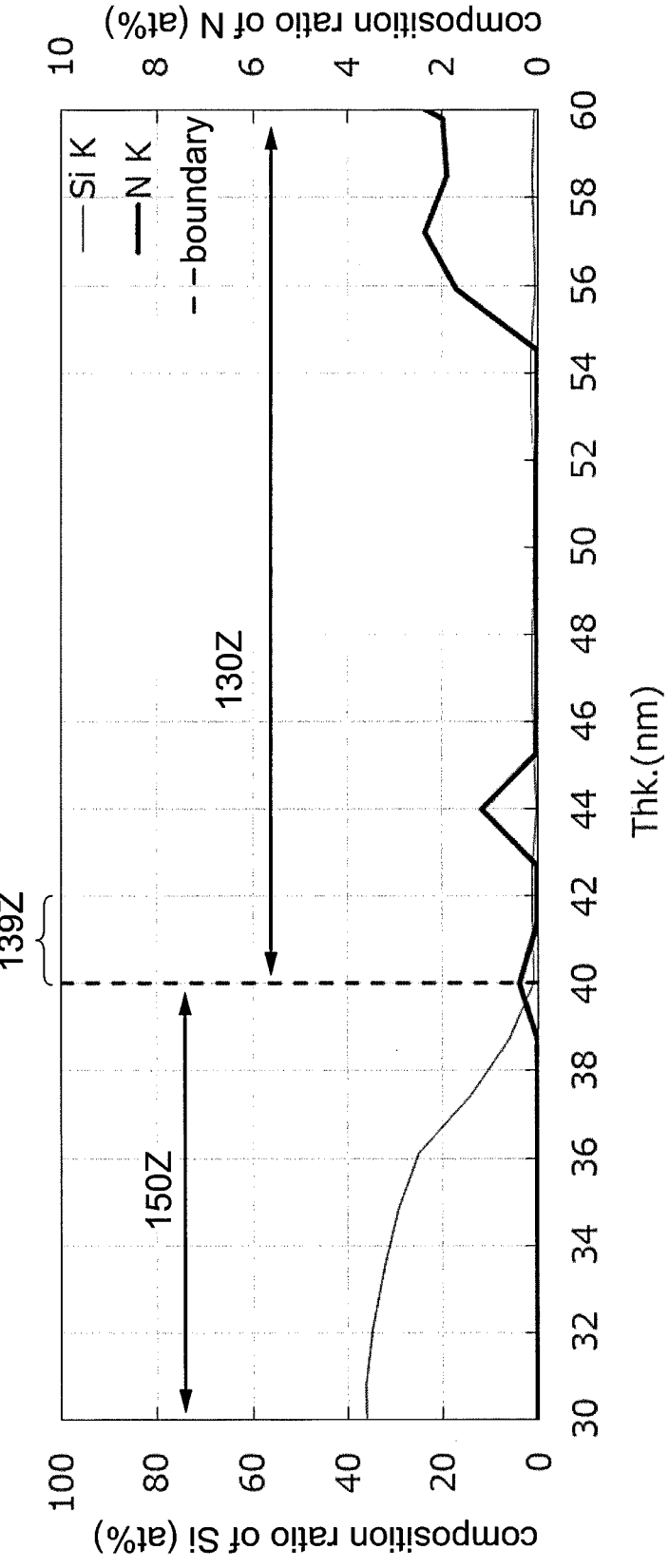
FIG. 6 is a diagram showing a result of composition analysis of a semiconductor device of Comparative Example.

In the semiconductor device 10Z according to the analysis results shown in FIG. 5 and FIG. 6, an example in which silicon oxide is used as a first gate insulating layer 120Z and the first insulating layer 150Z, and IGZO is used as the first oxide semiconductor layer 130Z is shown. The composition ratio (the spectrum 229Z) of silicon abruptly changes at the boundary between the first gate insulating layer 120Z and the first oxide semiconductor layer 130Z and at the boundary between the first insulating layer 150Z and the first oxide semiconductor layer 130Z. Nitrogen (the spectrum 219Z) has been detected in the first oxide semiconductor layer 130Z. In the comparative example of FIG. 5, nitrogen is detected in the vicinity of the center of the first oxide semiconductor layer 130Z. On the other hand, as shown in FIG. 6, nitrogen is hardly detected in the vicinity of the boundary between the first insulating layer 150Z and the first oxide semiconductor layer 130Z. In FIG. 6, a position where the spectrum of the silicon detected by the first insulating layer 150Z is lowered to the background level may be defined as the boundary between the first insulating layer 150Z and the first oxide semiconductor layer 130Z. In FIG.

6, a range of a depth within 2 nanometers from the boundary is defined as the region 139Z.

Figure 7:
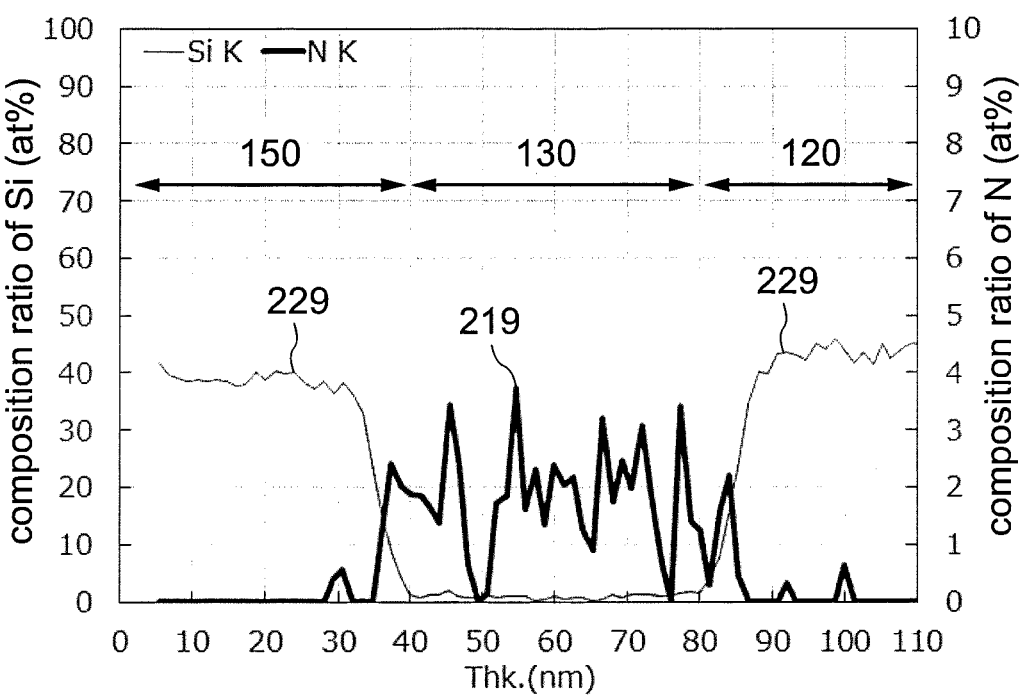
FIG. 7 is a diagram showing a result of composition analysis of a semiconductor device according to an embodiment of the present invention.
Figure 8:
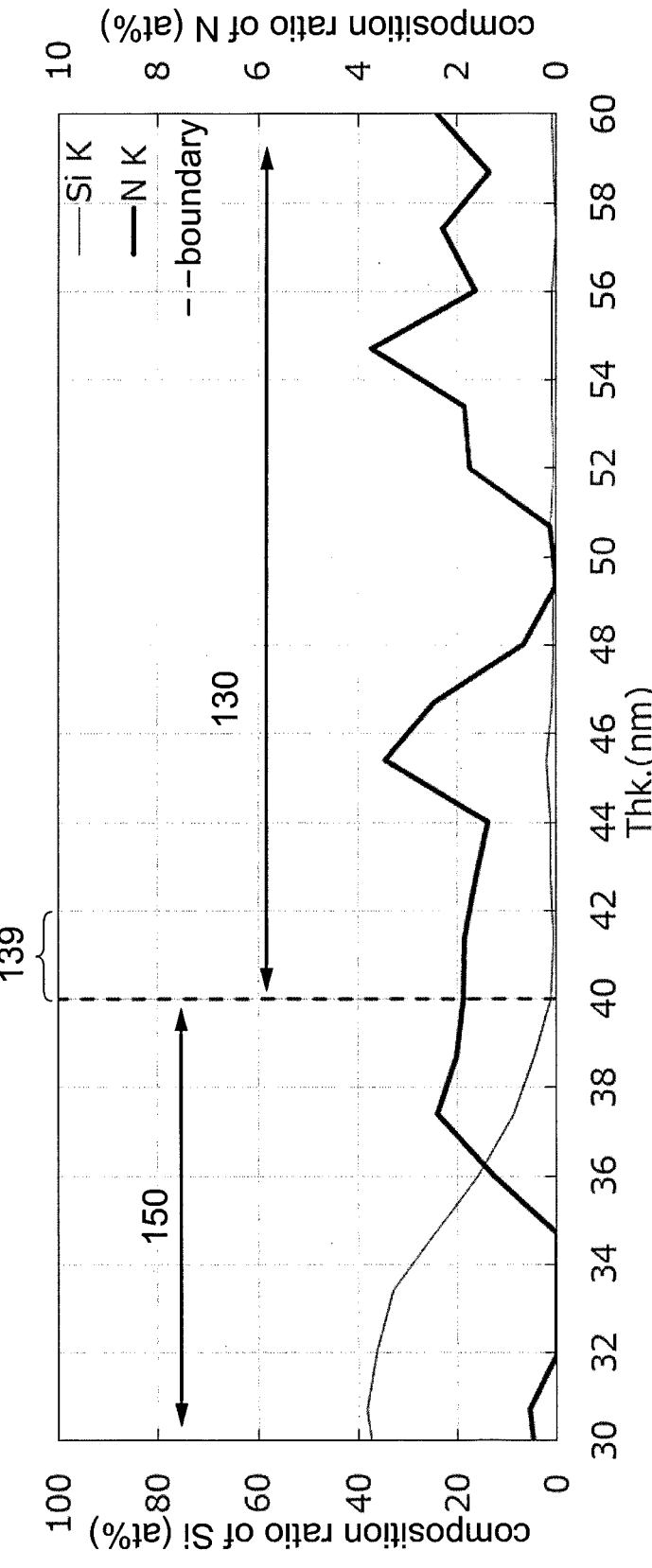
FIG. 8 is a diagram showing a result of composition analysis of a semiconductor device according to an embodiment of the present invention.

Analysis Result of Nitrogen-Containing Region 139 According to the Present Embodiment Results of composition analysis of the first oxide semiconductor layer 130 of the semiconductor device 10 of the present embodiment will be described with reference to FIG. 7 and FIG. 8. FIG. 7 is a diagram showing the results of composition analysis of the semiconductor device according to an embodiment of the present invention. FIG. 8 is an enlarged view of the vicinity of the boundary between the first insulating layer 150 and the first oxide semiconductor layer 130 of FIG. 7. In the following description, a description of a point that overlaps FIG. 5 and FIG. 6 will be omitted.

As shown in FIG. 7, in the semiconductor device 10, nitrogen is detected near the boundary between the first insulating layer 150 and the first oxide semiconductor layer 130. As shown in FIG. 8, there is a region having a nitrogen composition ratio of about 2% (the correct value of the graph in FIG. 8 is 1.88%) or more within the range of 2 nanometers (the nitrogen-containing region 139) in the depth direction from the boundary between the first insulating layer 150 and the first oxide semiconductor layer 130.

Figure 9:
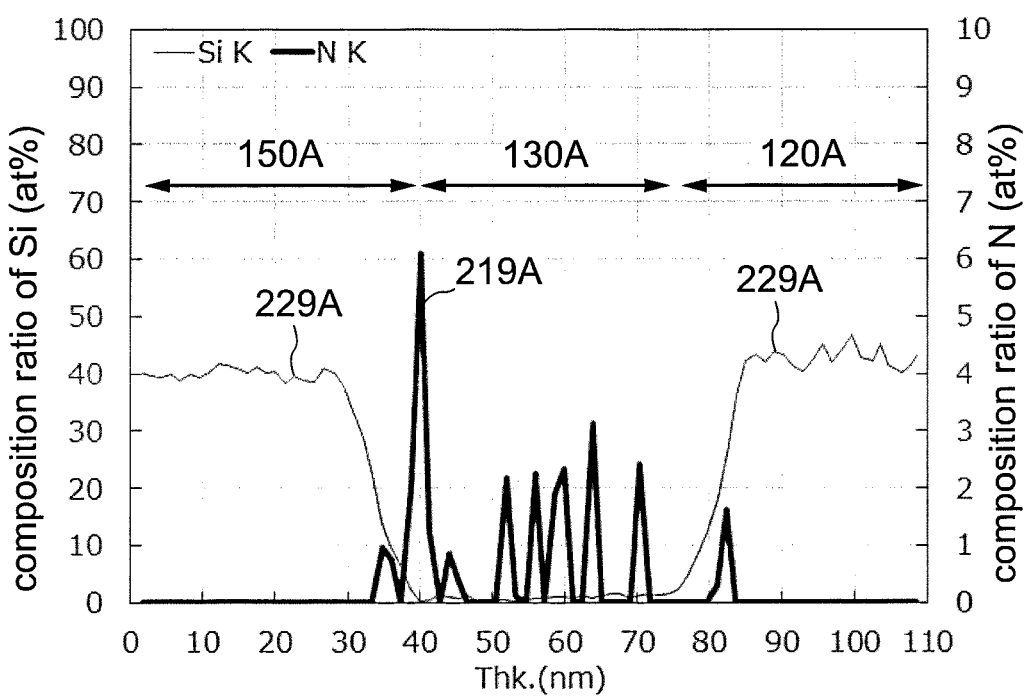
FIG. 9 is a diagram showing a result of composition analysis of a semiconductor device according to an embodiment of the present invention.
Figure 10:
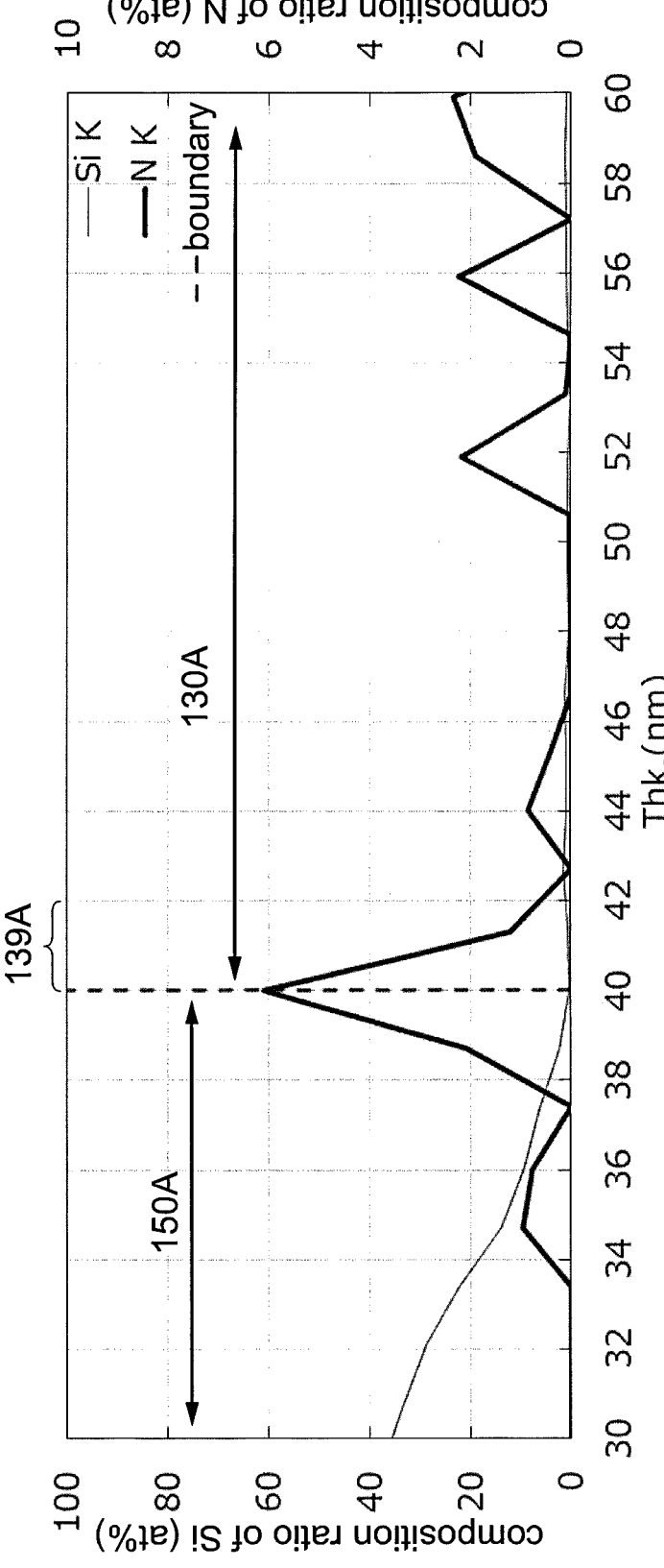
FIG. 10 is a diagram showing a result of composition analysis of a semiconductor device according to an embodiment of the present invention.

Analysis Result of Nitrogen-Containing Region 139A According to the Present Embodiment The results of composition analysis of a first oxide semiconductor layer 130A of a semiconductor device 10A of the present embodiment will be described with reference to FIG. 9 and FIG. 10. Since a configuration of the semiconductor device 10A in the present embodiment is substantially the same as the configuration of the semiconductor device 10 described above, the configuration of the semiconductor device 10A will be described with reference to FIG. 1. However, in order to distinguish between them, the reference signs of the respective components in FIG. 9 and FIG. 10 are denoted by reference signs with the addition of "A" after the reference signs of the respective configurations in FIG. 7 and FIG. 8. FIG. 9 is a diagram showing a result of composition analysis of a semiconductor device according to an embodiment of the present invention. FIG. 10 is an enlarged view of the vicinity of the boundary between a first insulating layer 150A and the first oxide semiconductor layer 130A in FIG. 9. The semiconductor device 10A has substantially the same configuration as that of the semiconductor device 10 shown in FIG. 7 and FIG. 8 but the condition for introducing nitrogen into the first oxide semiconductor layer 130A is different. As a result, the composition ratio of nitrogen in a nitrogen-containing region 139A of the semiconductor device 10A is greater than the composition ratio of nitrogen in the nitrogen-containing region 139 of the semiconductor device 10.

As shown in FIG. 9, in the semiconductor device 10A, the composition ratio of nitrogen in the vicinity of the boundary between the first insulating layer 150A and the first oxide semiconductor layer 130A is larger than the composition ratio of nitrogen in the vicinity of the boundary between the first oxide semiconductor layer 130 and the first insulating layer 150 of the semiconductor device 10. As shown in FIG. 10, in the depth direction from the boundary between the first insulating layer 150A and the first oxide semiconductor layer 130A, there is a region having a nitrogen composition ratio of 6% (the correct value of the graph in FIG. 10 is 6.09%) or more within the range of 2 nanometers (the nitrogen-containing region 139A).

Reliability Test Results of Semiconductor Devices 10, 10A, 10Z

Figure 11:
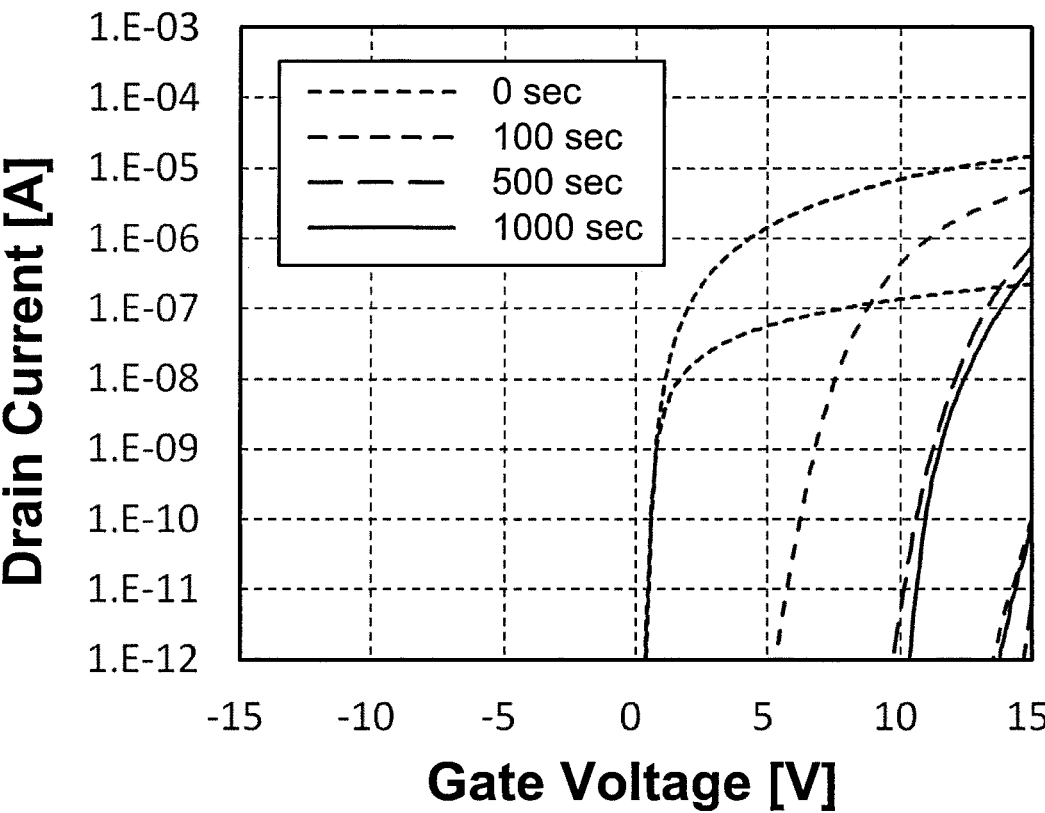
FIG. 11 is a diagram showing reliability test results performed on a semiconductor device of Comparative Example.
Figure 12:
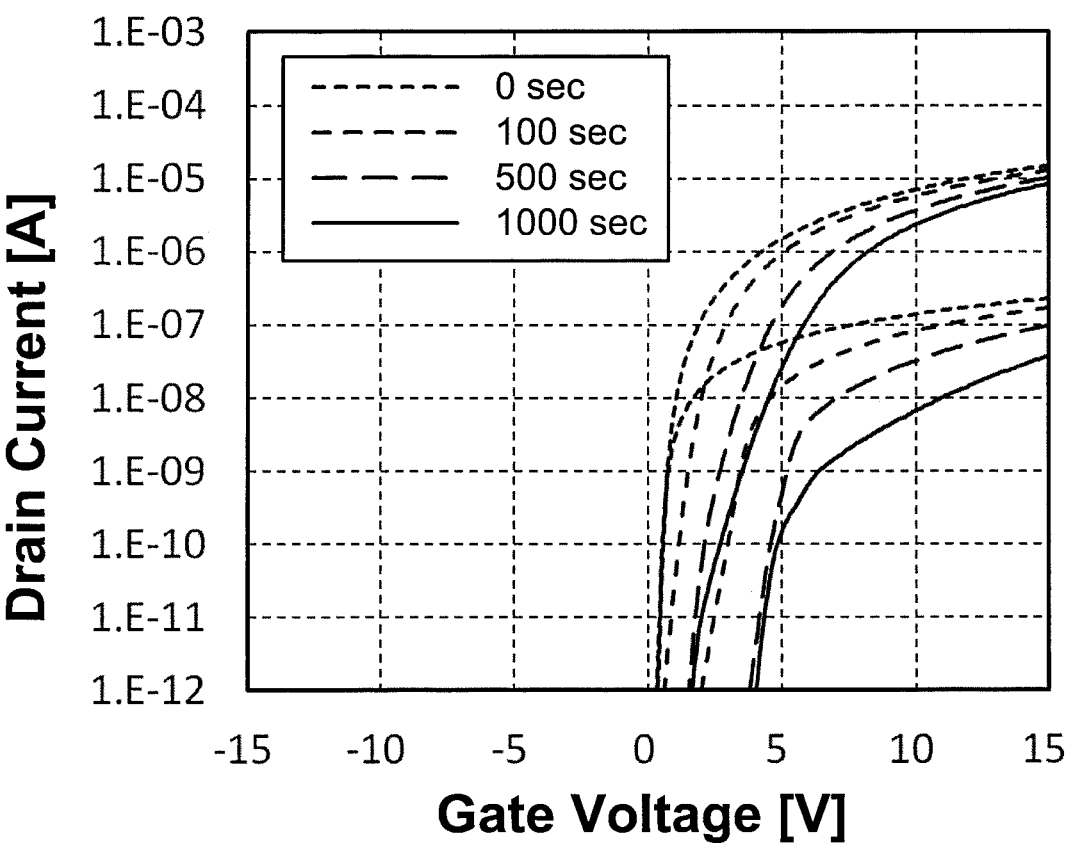
FIG. 12 is a diagram showing reliability test results performed on a semiconductor device according to an embodiment of the present invention.
Figure 13:
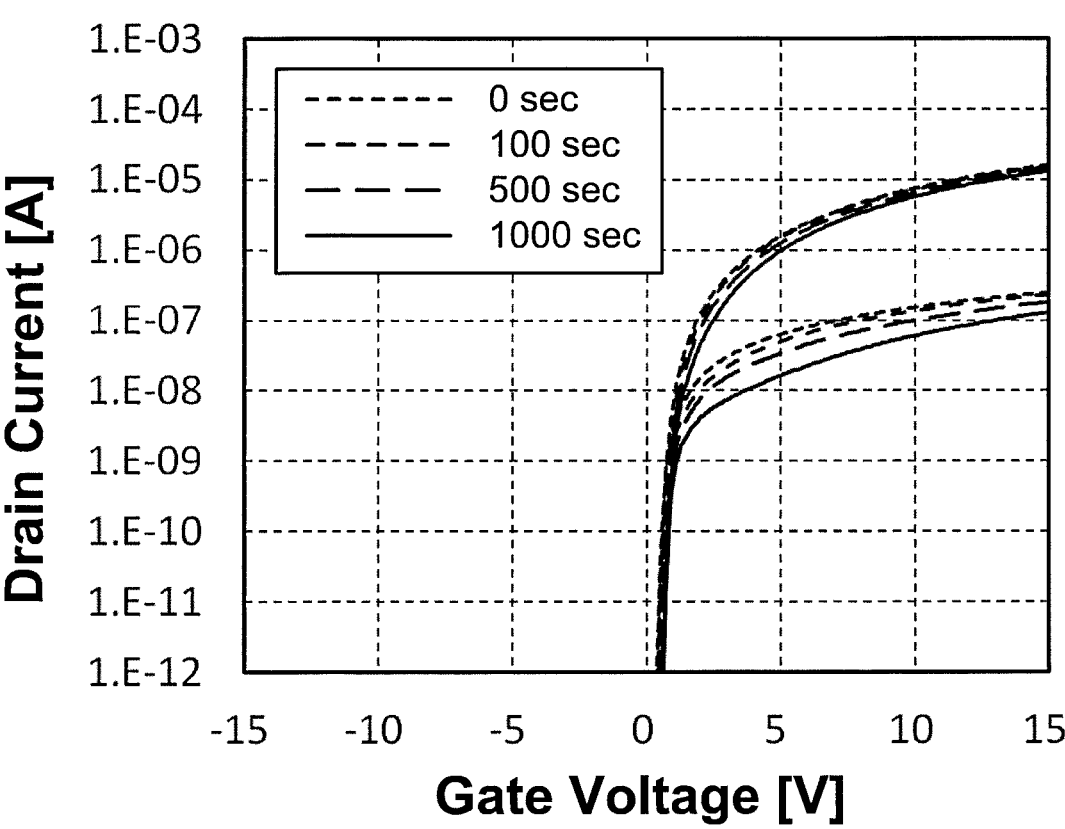
FIG. 13 is a diagram showing reliability test results performed on a semiconductor device according to an embodiment of the present invention.

FIG. 11 to FIG. 13 are diagrams showing reliability test results of the semiconductor devices of Comparative Example and the present embodiment. The reliability tests shown in FIG. 11 to FIG. 13 are tests for evaluating NBTS (Negative Bias Thermal Stress) reliability. Conditions for the NBTS reliability test are as follows.

Light irradiation condition: No irradiation (dark room)
Gating voltage: −40 V
Source and drain voltage: 0 V
Stage temperature at the time of applying stress: 125° C.

As shown in FIG. 11 to FIG. 13, results of evaluating electrical characteristics of each semiconductor device before the stress application (0 sec) and after each stress application period (100 sec to 1000 sec) has elapsed are overlapped and displayed. The conditions for measuring the electrical characteristics of the semiconductor device before and after stress application are as follows.

Source-drain voltage: 0.1 V, 10 V
Gate scan voltage: −15 V to 15 V
Measurement environment: Dark room
Stage temperature at the time of measurement: 125° C. (or "R.T. (room temperature)")

As shown in FIG. 11, in the semiconductor device 10Z of Comparative Example, the threshold value is positively shifted with increasing stress application time, and the rise of ON current gradually becomes gentler (hereinafter, these phenomena are referred to as "reliability deterioration"). Such reliability deterioration is improved in FIG. 12 and FIG. 13. In particular, in FIG. 13, there is little positive shift of the threshold.

Referring to the nitrogen-containing regions 139 and 139A and the region 139Z shown in FIG. 5 to FIG. 10, the reason why the reliability of the semiconductor devices of FIG. 11 to FIG. 13 are improved is considered to be correlated with the nitrogen contained in the nitrogen-containing regions 139 and 139A. In other words, it is considered that the higher the composition ratio of nitrogen in the nitrogen-containing regions 139 and 139A, the greater the effect of improving the reliability. There is no correlation between the amounts of nitrogen at the region closer to the first gate insulating layers 120, 120A, and 120Z than the position 10 nm from the upper surface of the first oxide semiconductor layers 130A and 130Z and the reliability of the semiconductor device. Therefore, it is considered that nitrogen in the vicinity of the upper surface of the first oxide semiconductor layer (particularly, in the range of a depth within 2 nanometers from the upper surface) is involved in improving the reliability of the semiconductor device.

Defects may occur on the upper surface of the first oxide semiconductor layer 130 due to the effects of processes such as film formation and etching of the first electrode 140. Although details will be described later, it is considered that the reliability deterioration caused by the reliability test described above is caused by the acceptor level of the defectives formed on the upper surface of the first oxide semiconductor layer 130. It is considered that the introduction of nitrogen into the first oxide semiconductor layer 130 having the defect of the acceptor level reduced the acceptor level and improved the reliability deterioration.

Simulation of Reliability Deterioration in
Semiconductor Device 10

Figure 14:
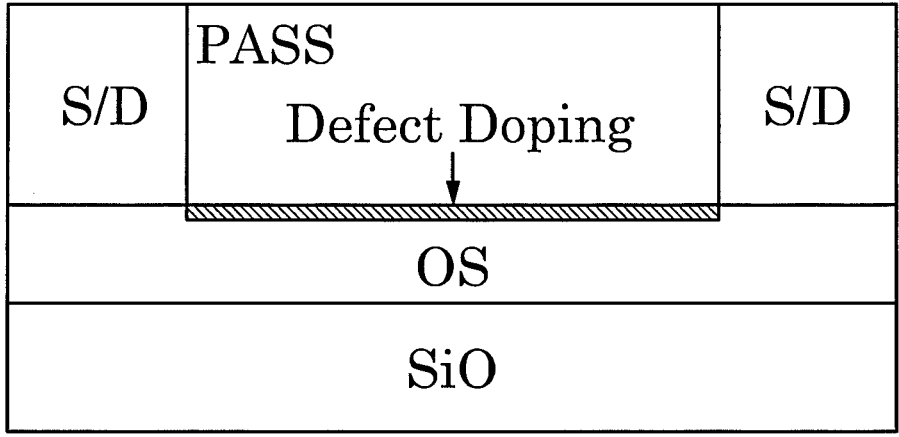
FIG. 14 is a diagram showing a model of a simulation performed on a semiconductor device according to an embodiment of the present invention.
Figure 15:
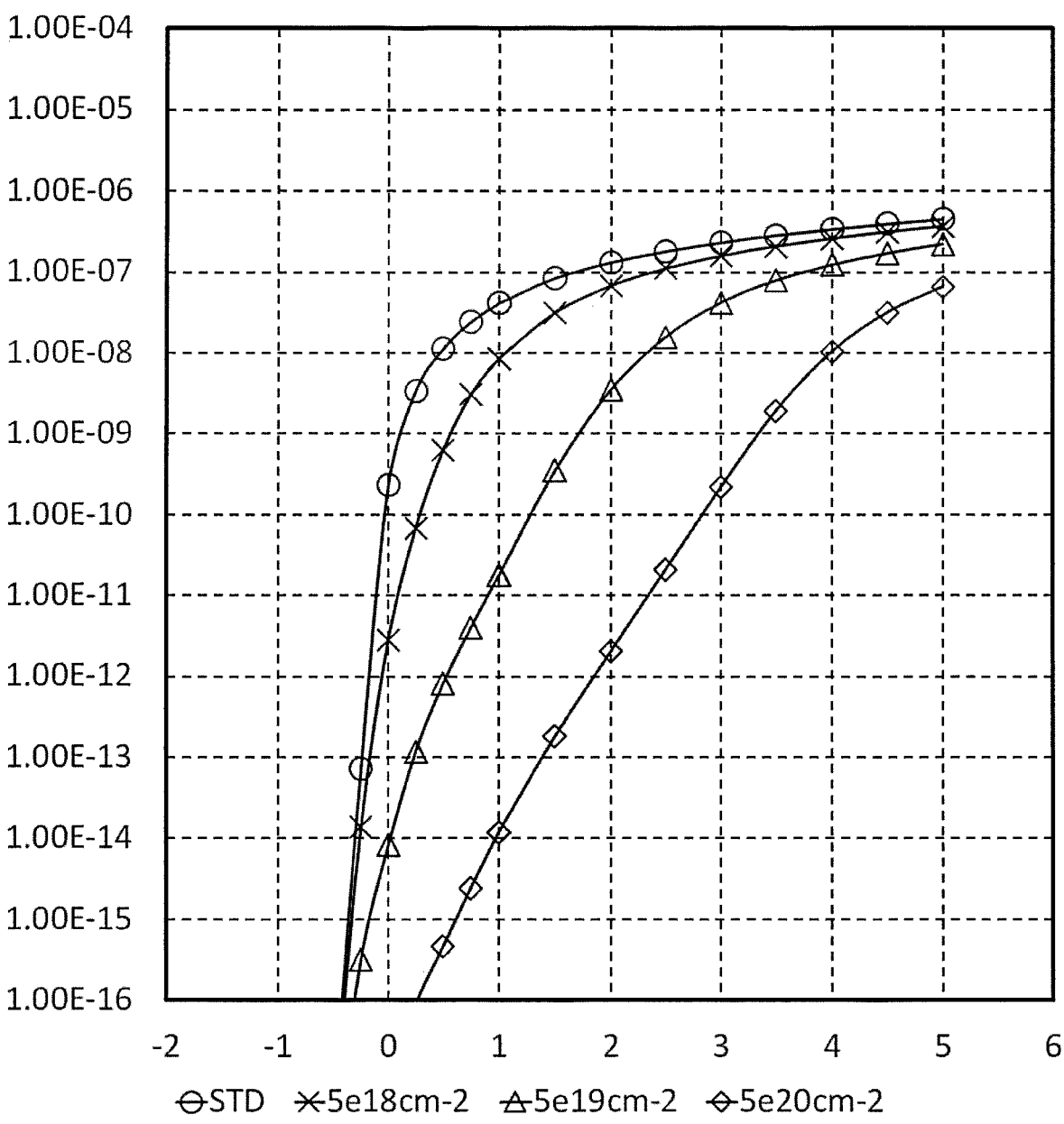
FIG. 15 is a diagram showing a result of a simulation performed on a semiconductor device according to an embodiment of the present invention.
Figure 16:
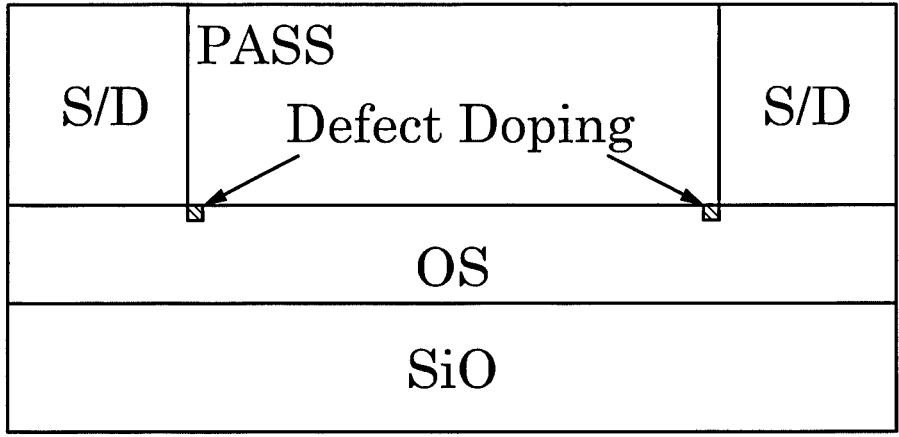
FIG. 16 is a diagram showing a model of a simulation performed on a semiconductor device according to an embodiment of the present invention.
Figure 17:
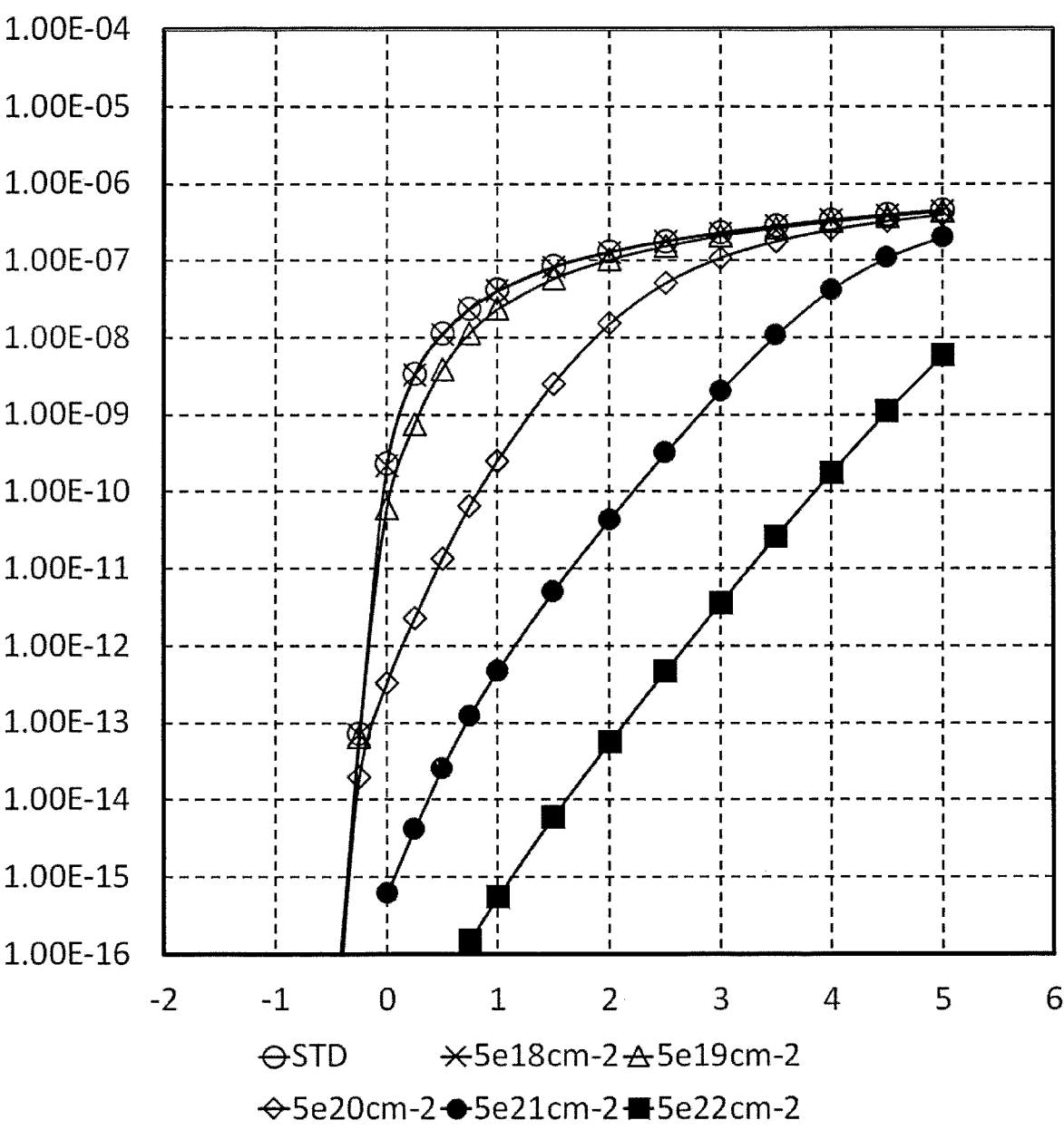
FIG. 17 is a diagram showing a result of a simulation performed on a semiconductor device according to an embodiment of the present invention.

Simulation results reproducing the reliability deteriora-
tion in the semiconductor device 10 will be described with
reference to FIG. 14 to FIG. 17. FIG. 14 and FIG. 16 are
diagrams showing models of simulations performed on a
semiconductor device according to an embodiment of the
present invention. FIG. 15 and FIG. 17 are diagrams show-
ing simulation results performed on a semiconductor device
according to an embodiment of the present invention. In
FIG. 14 and FIG. 16, "SiO" corresponds to the first gate
insulating layer 120 of FIG. 1, "OS" corresponds to the first
oxide semiconductor layer 130 of FIG. 1, "S/D" corresponds
to the first electrode 140, and "PASS" corresponds to the first
insulating layer 150.

As shown in FIG. 14 and FIG. 16, a defective region
(Defect Doping) of the acceptor level is set on the surface of
OS. In FIG. 14, "Defect Doping" is set on OS of a region
corresponding to the entire region of the channel region 131
and the vicinity of the upper surface of the first oxide
semiconductor layer 130. In FIG. 16, "Defect Doping" is set
only on the OS in the region of the channel region 131
corresponding to the vicinity of the end portion of the first
electrode 140 (S/D).

The electrical characteristics (Id-Vg characteristics) of the
semiconductor device shown in FIG. 15 are simulation
results calculated by the simulation model of FIG. 14. The
electrical characteristics (Id-Vg characteristics) of the semi-
conductor device shown in FIG. 17 are simulation results
calculated by the simulation model of FIG. 16. The simu-
lation result is a result calculated by changing the condition
for each defect-density in the "Defect Doping". In FIG. 15,
simulation results performed under the conditions that
Defect Doping is zero (STD), $5\times10^{18}$ cm$^{-2}$, $5\times10^{19}$ cm$^{-2}$,
and $5\times10^{20}$ cm$^{-2}$ are shown. In FIG. 17, simulation results
performed under the conditions that Defect Doping is zero
(STD), $5\times10^{18}$ cm$^{-2}$, $5\times10^{19}$ cm$^{-2}$, $5\times10^{20}$ cm$^{-2}$, $5\times10^{21}$
cm$^{-2}$, and $5\times10^{22}$ cm$^{-2}$ are shown.

In both of the simulation results of FIG. 15 and FIG. 17,
the threshold value is positively shifted in the electrical
characteristics of the semiconductor device 10 as the
"Defect Doping" is increased, and the rise of ON current is
gradual. In other words, the reliability deterioration caused
by the "Defect Doping" was reproduced in the simulation
results. The simulation results of FIG. 17 also reproduce the
reliability deterioration. Therefore, defects in the acceptor
level included in the channel region 131 of the semiconduc-
tor device 10 in the vicinity of the end portion of the first
electrode 140 and in the vicinity of the upper surface of the
first oxide semiconductor layer 130 are considered to be the
reason for the reliability deterioration.

Considering the experimental results shown in FIG. 4 to
FIG. 13 and the simulation results shown in FIG. 14 to FIG.
17, the presence of a region having a nitrogen composition
ratio of 2% or more within 2 nanometers in the depth
direction from the upper surface of the first oxide semicon-
ductor layer 130 in the first oxide semiconductor layer 130
in the vicinity of the end portion of the first electrode 140
among the channel region 131 (particularly, the vicinity of
the end portion of the first electrode 140 functioning as the
source electrode) can improve the reliability deterioration in
the semiconductor device 10.

Material of Each Member of the Semiconductor
Device 10

A substrate including a resin such as a polyimide sub-
strate, an acrylic substrate, a siloxane substrate or a fluo-
roresin substrate can be used as the substrate 100. That is, it
is possible to use a flexible substrate having flexibility as the
substrate 100. Impurities may also be introduced into the
resin described above in order to improve heat resistance of
the substrate 100. In particular, in the case where the
semiconductor device 10 is a top emission type display, it is
not necessary that the substrate 100 be transparent. There-
fore, it is possible to use impurities which deteriorate the
transparency of the substrate 100. On the other hand, in the
case where the substrate 100 does not need flexibility, a rigid
substrate which has translucency but does not have flexibil-
ity such as a glass substrate, a quartz substrate and a sapphire
substrate can be used as the substrate 100. In the case where
the semiconductor device 10 is used for an integrated circuit
which is not a display device, it is possible to use a silicon
substrate, a silicon carbide substrate, or a compound semi-
conductor substrate, or a substrate which does not have
translucency such as a conductive substrate such as a
stainless steel substrate as the substrate 100.

It is possible to use a general metal material as the first
gate electrode 110, the first electrode 140, and the first
conductive layer 170. For example, it is possible to use
aluminum (Al), titanium (Ti), chromium (Cr), cobalt (Co),
nickel (Ni), molybdenum (Mo), hafnium (Hf), tantalum
(Ta), tungsten (W), bismuth (Bi), silver (Ag) or an alloy or
compound of these materials as these members. Each of the
first gate electrode 110, the first electrode 140, and the first
conductive layer 170 may be a single layer or may be a
stacked layer of the materials described above.

For example, the metal element constituting the first
electrode 140 in contact with the first oxide semiconductor
layer 130 among the first electrode 140 is more stable than
the oxide of the metal element constituting the first oxide
semiconductor layer 130. That is, in the case where there is
a plurality of metal elements constituting the first oxide
semiconductor layer 130, it is preferable that the Gibbs free
energy ($\Delta$Gf) of the metal oxide of the metal element
constituting the first electrode 140 in contact with the first
oxide semiconductor layer 130 is smaller than the Gibbs free
energy of the metal oxide of each of the plurality of metal
elements.

For example, when IGZO is used as the first oxide
semiconductor layer 130, Ti may be used as a metal in
contact with the IGZO. The Gibbs free energy of indium
oxide is greater than the Gibbs free energy of each of Ga
oxide and Zn oxide. Thus, indium oxide is chemically
unstable and easily reduced. On the other hand, since the
Gibbs free energy of Ti oxide is sufficiently smaller than the
Gibbs free energy of each of Ga oxide and Zn oxide, when
Ti is formed on IGZO, Ti combines with oxygen in IGZO to
form Ti oxide. Since indium oxide is easily reduced as
described above, when high-energy is supplied in a state in
which IGZO and Ti are in contact with each other, indium
oxide is reduced and Ti is oxidized. For the semiconductor
device 10, when Ti is repositioned on IGZO, resistance of
IGZO is reduced because Ti deprives oxygen from upper
part of IGZO (the first region 133) and IGZO in the first
region 133 becomes a n-type. This phenomena reduces
resistance between IGZO and Ti.

A common insulating material can be used as the first gate
insulating layer 120 and the first insulating layer 150. For
example, as to these insulating layers, it is possible to use
such as silicon oxide (SiO$_x$), silicon oxynitride (SiO$_x$N$_y$),
silicon nitride (SiN$_x$), silicon nitride oxide (SiNO$_y$), alumi-
num oxide (AlO$_x$), aluminum oxynitride (AlO$_x$N$_y$), alumi-
num nitride oxide (AlN$_x$O$_y$), aluminum nitride (AlN$_x$) and
the like inorganic insulating layer can be used. A low-defect insulating layer can be used as these insulating layers. For example, when a composition ratio of oxygen in the first insulating layer 150 is compared with a composition ratio of oxygen in an insulating layer (hereinafter referred to as "other insulating layer") having the same composition as that of the first insulating layer 150, the composition ratio of oxygen in the first insulating layer 150 is closer to stoichiometric ratio of the insulating layer having the same composition as that of the first insulating layer 150 than the composition ratio of oxygen in the other insulating layer.

$SiO_xN_y$ and $AlO_xN_y$ described above are a silicon compound and an aluminum compound containing nitrogen (N) at a smaller amount than oxygen (O) (x>y). In addition, $SiN_xO_y$ and $AlN_xO_y$ are a silicon compound and an aluminum compound containing oxygen at a smaller amount than nitrogen (x>y).

It is possible to use a metal oxide having semiconductor characteristics as the first oxide semiconductor layer 130. For example, it is possible to use an oxide semiconductor containing indium (In), gallium (Ga), zinc (Zn), and oxygen (O) as the first oxide semiconductor layer 130. In particular, it is possible to use an oxide semiconductor having a composition ratio of In:Ga:Zn:O=1:1:1:4 as the first oxide semiconductor layer 130. However, the oxide semiconductor which is used in this embodiment and includes In, Ga, Zn, and O is not limited to the composition described above. It is possible to use an oxide semiconductor having a composition different from that described above as the oxide semiconductor. For example, the In ratio may be increased more than the ratio described above in order to improve mobility. In addition, in order to increase the band gap and reduce the influence of light irradiation, the Ga ratio may also be increased more than the ratio described above.

Other elements may also be added to the oxide semiconductor containing In, Ga, Zn, and O. For example, a metal element such as Al or Sn may be added to the oxide semiconductor. In addition to the oxide semiconductors described above, an oxide semiconductor containing In and Ga (IGO), an oxide semiconductor containing In and Zn (IZO), an oxide semiconductor containing In, Sn and Zn (ITZO), and an oxide semiconductor containing In and W and the like can be used for the first oxide semiconductor layer 130. The first oxide semiconductor layer 130 may be amorphous or crystalline. The first oxide semiconductor layer 130 may also be a mixed phase of amorphous and crystalline.

It is possible to use an oxide semiconductor layer having the same composition as the first oxide semiconductor layer 130, an oxide conductive layer such as ITO, or an oxide insulating layer such as $SiO_x$, $SiO_xN_y$, $AlO_x$, and $AlO_xN_y$ as the oxide layer 160. The oxide layer 160 is preferred to be formed by a sputtering method. In the case where the oxide layer 160 is formed by a sputtering method, a process gas which is used in the sputtering may sometimes remain in the oxide layer 160 film. For example, in the case where argon (Ar) is used as the sputtering process gas, Ar remains within the oxide layer 160 film. The remaining Ar can be detected in the oxide layer 160 by SIMS (Secondary Ion Mass Spectrometry) analysis. In the case where an oxide insulating layer having the same composition as the material which is used for the first insulating layer 150 is used as the oxide layer 160, the composition ratio of oxygen in the oxide layer 160 is larger than the composition ratio of oxygen in the first insulating layer 150.

Second Embodiment

A semiconductor device according to an embodiment of the present invention will be described with reference to FIG. 18 to FIG. 33. The semiconductor device shown below may be used in an integrated circuit (Integrated Circuit: IC) such as a micro-processing unit (Micro-Processing Unit: MPU) or a memory circuit, in addition to a transistor used in a display device.

Configuration of Semiconductor Device 10B

Since the entire configuration of a semiconductor device 10B according to the second embodiment is the same as the entire configuration of the semiconductor device 10 according to the first embodiment (FIG. 1), the explanation thereof will be omitted. The semiconductor device 10B may be described with reference to FIG. 1. In such a case, the reference sign of the member shown in FIG. 1 is followed by "B" to be described. FIG. 18 is an enlarged cross-sectional view of a portion of a semiconductor device according to an embodiment of the present invention. FIG. 18 corresponds to an enlarged view of a region surrounded by a dotted line frame in FIG. 1.

As is shown in FIG. 18, a first electrode 140B has a first conductive layer 145B, a second conductive layer 147B, and a third conductive layer 149B in the present embodiment. An oxide portion 180B is arranged at a pattern end of the first electrode 140B. The oxide portion 180B is arranged above the first oxide semiconductor layer 130B. The oxide portion 180B is an oxide of the first electrode 140B. Specifically, the oxide portion 180B includes a first oxide portion 185B and a third oxide portion 189B. The first oxide portion 185B is arranged at an end portion of the first conductive layer 145B which is an oxide of the first conductive layer 145B. The third oxide portion 189B is arranged at an end portion of the third conductive layer 149B which is an oxide of the third conductive layer 149B. The first oxide portion 185B has a conductivity. Further, the first oxide portion 185B is located on the channel region 131B side than a pattern end of the second conductive layer 147B.

In the present embodiment, although the structure in which an oxide of the second conductive layer 147B is not arranged is exemplified, a second oxide portion which is an oxide of the second conductive layer 147B may be arranged on the end portion of the second conductive layer 147B between the first oxide portion 185B and the third oxide portion 189B. That is, the second oxide portion is arranged at an end portion of the second conductive layer 147B. Detail will be described later, although the second oxide portion is formed during the manufacturing process of the semiconductor device 10B in the present embodiment, the second oxide portion is removed in a subsequent process, therefore the structure shown in FIG. 18 is formed. The first oxide portion 185B may not have a conductivity.

A channel region 131B, a first region 133B, and a second 135B are arranged in the first oxide semiconductor layer 130B.

Most of the channel region 131B is a region where the first electrode 140B is not arranged above the first oxide semiconductor layer 130B. The oxide portion 180B is arranged above the first oxide semiconductor layer 130B of the channel region 131B. That is, the oxide portion 180B overlaps the region 131B in a plan view. Around the end portion of the oxide portion 180B side of the first electrode 140B overlaps a portion of the channel region 131B in a plan view. However, the first electrode 140B may not overlap the channel region 131B in a plan view.

The first region 133B and the second region 135B are regions where the first electrode 140B is arranged above the first oxide semiconductor layer 130B. In other words, the channel region 131B is a region where the first oxide semiconductor layer 130B is exposed from the first electrode 140B in a plan view. The first region 133B and the second region 135B are regions where the first oxide semiconductor layer 130B overlaps the first electrodes 140B in a plan view. The oxide portion 180B is not arranged above the first oxide semiconductor layer 130B in the first region 133B and the second region 135B. The first region 133B is arranged substantially an entire area where the first oxide semiconductor layer 130B overlaps the first electrode 140B. On the other hand, the second region 135B is arranged at a position farther from the oxide portion 180B compared to the first region 133B in a plan view. That is, there is a region where the second region 135B is not arranged below the first electrodes 140B.

The channel region 131B, the first region 133B, and the second region 135B are each formed from one oxide semiconductor layer. These regions are the same composition and the same crystalline state immediately after the oxide semiconductor layer is deposited. However, the compositions and crystalline states of the first oxide semiconductor layer 130B in each region differ depending on the effect of the manufacturing process of the semiconductor device 10B.

In the first oxide semiconductor layer 130B in the first region 133B and the second region 135B, indium included in the first oxide semiconductor layer 130B is unevenly distributed. On the other hand, in the first oxide semiconductor layer 130B in the channel region 131B, indium is not unevenly distributed. The presence or absence of unevenly distributed indium in the first oxide semiconductor layer 130B may vary depending on a method of measurement and an accuracy of measurement. When it is determined that indium is unevenly distributed in the first oxide semiconductor layer 130B in the channel region 131B, the degree (or amount) of uneven distribution of indium in the first oxide semiconductor layer 130B in the channel region 131B is larger than the degree (or amount) of uneven distribution of indium in the first oxide semiconductor layer 130B in the first region 133B and the second region 135B. Further, the degree of uneven distribution of indium in the first oxide semiconductor layer 130B in the second region 135B is larger than the degree of uneven distribution of indium in the first oxide semiconductor layer 130B in the first region 133B.

In this case, a large degree of uneven distribution of indium means that a size of region (high density region) where indium density is higher than the other region, or a size (or crystalline particle size) of crystallized indium is larger than the other region.

The degree of uneven distribution of indium can be determined by, for example, a cross-sectional TEM (Transmission Electron Microscope) image, a cross-sectional STEM (Scanning Transmission Electron Microscope) image, or a cross-sectional SEM (Scanning Electron Microscope) image. For example, in the case where a contrast of the first oxide semiconductor layer 130B in the channel region 131B is larger than a contrast of the first oxide semiconductor layer 130B in the first region 133B and the second region 135B, it can be determined that the degree of uneven distribution of indium in the first region 133B and the second region 135B is larger than the degree of uneven distribution of indium in the channel region 131B.

Alternatively, in the case where a size of a mass of "bright" portion or "dark" portion in the contrast in the cross-sectional image mentioned above are relatively large, it can be determined that the degree of uneven distribution of indium is large. Alternatively, for example, in mapping analysis (plane analysis) of EDX (Energy Dispersive X-ray spectrometry) using SEM or STEM, in the case where a signal strength due to indium is larger than the other region, that is, in the case where a region with dense indium is relatively larger than the other region, the degree of uneven distribution of indium can be determined to be large.

Method for Manufacturing Semiconductor Device
10B

A method for manufacturing the semiconductor device 10B according to an embodiment of the present invention will be described using FIG. 19 to FIG. 22. FIG. 19 to FIG. 22 are cross-sectional views showing a method for manufacturing a semiconductor device according to an embodiment of the present invention. In the following explanation of the manufacturing process, an example in which Ti is used as the first conductive layer 145B and the third conductive layer 149B, and Al is used as the second conductive layer 147B will be described.

As shown in FIG. 19, a pattern of the first oxide semiconductor layer 130B is formed on the first gate insulating layer 120B arranged on the first gate electrode 110B (refer to FIG. 1), and a pattern of the first electrode 140B is formed. A pattern end of the first electrode 140B is located on the first oxide semiconductor layer 130B. Since a general semiconductor process can be used for the manufacturing method up to the structure shown in FIG. 19, a detailed description thereof is omitted.

Next, as shown in FIG. 20, a plasma treatment using gasses containing oxygen and nitrogen is performed on the first oxide semiconductor layer 130B and the first electrodes 140B. In the present embodiment, performing a plasma treatment using $N_2O$ gas (hereinafter, referred to as "$N_2O$ plasma treatment") as the plasma treatment. In other words, $N_2O$ plasma treatment is performed on at least the pattern end of the first electrode 140B.

As shown in FIG. 21, an oxide portion 180B is formed on the end portion of the first electrode 140B by $N_2O$ plasma treatment. Specifically, a first oxide portion 185B is formed on the end portion of the first conductive layer 145B, a second oxide portion 187B is formed on the end portion of the second conductive layer 147B, and a third oxide portion 189B is formed on end portion of the third conductive layer 149B. The upper portion of the third conductive layer 149B, which is the uppermost layer of the first electrode 140B, is also oxidized by $N_2O$ plasma treatment, but the oxidized part is omitted for convenience of explanation.

The second oxide portion 187B of the oxide portion 180B disappears during the process forming the first insulating layer 150B covering the first electrodes 140B. As a result, only the first oxide portion 185B and the third oxide portion 189B remain on the end portion of the first electrodes 140B as shown in FIG. 22.

In the present embodiment, although an example in which all of the second oxide portion 187B disappear is shown, part of the second oxide portion 187B may remain. The second oxide portion 187B may not disappear and the first insulating layer 150B may be formed on the structure shown in FIG. 21.

By performing a heat treatment after forming the first insulating layer 150B described above, indium is segregated (uneven distribution of indium is formed) in the first oxide semiconductor layer 130B in a region overlapping with the first electrode 140B in a plan view.

Uneven Distribution of Indium in First Oxide
Semiconductor Layer 130B

Uneven distribution of indium in the channel region
131B, the first region 133B, and the second region 135B of
the first oxide semiconductor layer 130B will be described
using FIG. 23 to FIG. 28. The cross-sectional image of the
semiconductor device 10B shown in FIG. 23 to FIG. 28 is
a cross-sectional image of the sample after manufacturing
the semiconductor device 10B and before performing the
reliability test.

FIG. 23 is a cross-sectional TEM image of a semicon-
ductor device according to an embodiment of the present
invention. In FIG. 23, similar to the above, a structure in
which Ti is used as the first conductive layer 145B and the
third oxide semiconductor layer 149B, Al is used as the
second conductive layer 147B, and IGZO is used as the first
oxide semiconductor layer 130B is shown. The first con-
ductive layer 145B (Ti) and the second conductive layer
147B (Al) have different patterns in a cross-sectional view
due to different crystalline states. In the first oxide semi-
conductor layer 130B, a region in which the first electrode
140B is not arranged on thereof corresponds to the channel
region 131B, and a region in which the first electrode 140B
is arranged on thereof corresponds to the first region 133B
and the second region 135B. Mixed crystal region is formed
in which Ti and Al are reacted between the first conductive
layer 145B and the second 147B.

In FIG. 23, the dotted line connecting the first conductive
layer 145B and the third conductive layer 149B is a portion
which is presumed that the end portion of the second 147B
was existed based on the shapes of these conductive layers.
As described above, at least a portion of the second con-
ductive layer 147B disappears, and shapes shown in FIG. 23
is formed.

FIG. 24 is a cross-sectional HAADF (High-Angle Annu-
lar Dark Field)-STEM image of a semiconductor device
according to an embodiment of the present invention. FIG.
24 is an enlarged STEM image of a portion of FIG. 23. In
FIG. 24, part of the first oxide semiconductor layer 130B,
the first conductive layer 145B, and the second conductive
layer 147B is shown. FIG. 25 to FIG. 28 are EDX-mapping
measurement results of the semiconductor device according
to an embodiment of the present invention, respectively.
FIG. 25 shows an EDX-mapping measurement result of Ti.
FIG. 26 shows an EDX-mapping measurement result of O.
FIG. 27 shows an EDX-mapping measurement result of In.
FIG. 28 shows an EDX-mapping measurement result of Al.
In each of the figure, regions where the first oxide semicon-
ductor layer 130B, the first conductive layer 145B, and the
second conductive layer 147B are arranged are indicated by
a dotted line.

Referring to FIG. 24 to FIG. 26, although Ti is detected
from a region surrounded by a dotted line showing the first
conductive layer 145B, near the left end of the dotted line,
the signal strength of Ti is smaller and the signal strength of
oxygen is larger than that of the other region. That is, the first
oxide portion 185B (Ti oxide) is formed on the left end of
the first conductive layer 145B. The first oxide portion 185B
has a partially missing shape, which is a concave shape in
the present embodiment. From FIG. 25 and FIG. 26, oxygen
is detected from the lower region of the first conductive layer
145B. That is, Ti oxide is formed under Ti.

Referring to FIG. 24 and FIG. 27, a region that is brighter
than the other region (hereinafter referred to as a "bright
region 200B") in the contrast of STEM image of FIG. 24 is
a region where indium density is higher than the other region as shown in FIG. 27. A region that is darker than the other
region in FIG. 24 (hereinafter referred to as a "dark region
210B") is a region where indium density is lower than the
other region as shown in FIG. 27.

As shown in FIG. 24, the size of the mass of the bright
region 200B in the second region 135B is larger than the size
of the mass of the bright region 200B in the first region
133B. In FIG. 24, it is determined that uneven distribution
of indium is not formed, because no clear mass of the bright
region 200B and the dark region 210B are identified in the
channel region 131B. A small-sized bright region is con-
firmed in the first region 133B, but it is considered that
oxygen of the oxide semiconductor is reduced at the surface
layer of the first oxide semiconductor layer 130B at the time
of Ti film deposition or in a process after the Ti film
deposition, and a region where indium density is high is
partially formed. It is considered that the oxide semicon-
ductor became n-type by reducing oxygen in the surface
layer of the first oxide semiconductor layer 130B. On the
other hand, in the first oxide semiconductor layer 130B in
the first region 133B and the second region 135B, since the
bright region 200B and the dark region 210B are localized,
it is determined that uneven distribution of indium is formed.

In other words, the degree of the uneven distribution of
indium mentioned above, the degree of the uneven distri-
bution of indium in the first oxide semiconductor layer 130B
in the first region 133B and second region 135B is larger
than the degree of the uneven distribution of indium of the
first oxide semiconductor layer 130B in the channel region
131B. That is, in a plan view, the degree of the uneven
distribution of indium in the first oxide semiconductor layer
130B in a region overlapping with the first oxide portion
185B is smaller than the degree of the uneven distribution of
indium in the first oxide semiconductor layer 130B in a
region overlapping with the first electrode 140B. In the
above example, in a plan view, the uneven distribution of
indium in the first oxide semiconductor layer 130B in a
region overlapping with the first oxide portion 185B is not
formed. The degree of the uneven distribution of indium in
the first oxide semiconductor layer 130B in the second
region 135B is larger than the degree of the uneven distri-
bution of indium in the first oxide semiconductor layer 130B
in the first region 133B. In this case, it is considered that
uneven distribution of indium is attributed to the crystalli-
zation of indium. Therefore, it can be said that, the crystal-
line particle size of the uneven distribution of indium in the
first oxide semiconductor layer 130B in the second region
135B is larger than the crystalline particle size of the
unevenly distributed indium in the first oxide semiconductor
layer 130B in the first region 133B.

As shown in FIG. 24 and FIG. 27, in the second region
135B, a region where uneven distribution of indium is
formed has not reached the end portion of the channel region
131b side of the first conductive layer 145B. That is, in this
condition, the rise problem of the ON current of the semi-
conductor device 10B does not occur.

Referring to FIG. 24, FIG. 26 and FIG. 28, a region in
which oxygen is not detected and a region in which Al is
detected substantially coincide with each other. That is, it is
considered that almost no Al oxide is formed in the end
portion of the second conductive layer 147B. At least in the
end portion of the second conductive layer 147B, there is no
Al oxide in the order of tens of nanometers. However, Al
oxide in the order of a few or several nanometers (smaller than ten nanometers) may exist in the end portion of the second conductive layer 147B.

Third Embodiment

A display device using a semiconductor device according to an embodiment of the present invention will be described with reference to FIG. 29 to FIG. 33. In the embodiment shown below, a configuration in which semiconductor device described in the first embodiment and the second embodiment described above are applied to the circuitry of liquid crystal display device will be described.

Outline of Display Device 20C

FIG. 29 is a plan view showing an outline of a display device according to an embodiment of the present invention. As is shown in FIG. 29, the display device 20C includes an array substrate 300C, a seal portion 400C, a counter substrate 500C, a flexible printed circuit substrate 600C (FPC 600C), and an IC chip 700C. The array substrate 300C and the counter substrate 500C are bonded together by the seal portion 400C. A plurality of pixel circuits 310C is arranged in a matrix in a liquid crystal region 22C which is surrounded by the seal portion 400C. The liquid crystal region 22C is a region which overlaps a liquid crystal element 410C described herein in a plan view.

A seal region 24C in which the seal portion 400C is arranged is a region in the periphery of the liquid crystal region 22C. The FPC 600C is arranged in a terminal region 26C. The terminal region 26C is a region where the array substrate 300C is exposed from the counter substrate 500C, and is arranged outside the seal region 24C. Furthermore, the outer side of the seal region 24C means a region in which the seal portion 400C is arranged and the outer side of the region surrounded by the seal portion 400C. The IC chip 700C is arranged on the FPC 600C. The IC chip 700C supplies a signal for driving each pixel circuit 310C.

Circuit Structure of Display Device 20C

FIG. 30 is a block diagram showing a circuit structure of a display device according to one embodiment of the present invention. As is shown in FIG. 30, a source driver circuit 320C is arranged at a position adjacent in a direction D1 (column direction) of the liquid crystal region 22C where the pixel circuit 310C is arranged, and a gate driver circuit 330C is arranged at a position adjacent in a direction D2 (row direction) of the liquid crystal region 22C. The source driver circuit 320C and the gate driver circuit 330C are arranged in the seal region 24C described above. However, the region where the source driver circuit 320C and the gate driver circuit 330C are arranged is not limited to the seal region 24C. The source driver circuit 320C and the gate driver circuit 330C may be arranged in a region outside a region where the pixel circuit 310C is arranged.

A source wiring 321C extends from the source driver circuit 320C in the direction D1 and is connected to a plurality of pixel circuits 310C arranged in the direction D1. A gate wiring 331C extends from the gate driver circuit 330C in the direction D2 and is connected to a plurality of pixel circuits 310C arranged in the direction D2.

A terminal portion 333C is arranged in the terminal region 26C. The terminal portion 333C and the source driver circuit 320C are connected by a connection wiring 341C. Similarly, the terminal portion 333C and the gate driver circuit 330C are connected by a connection wiring 341C. By connecting the FPC 600C to the terminal portion 333C, an external device which is connected to the FPC 600C and the display device 20C are connected, and a signal from the external device drives each pixel circuit 310C arranged in the display device 20C.

The semiconductor devices 10 and 10A shown in the first embodiment and the second embodiment are applied to transistors included in the pixel circuit 310C, the source driver circuit 320C and the gate driver circuit 330C.

Pixel Circuit 310C of Display Device 20C

FIG. 31 is a circuit diagram showing a pixel circuit of a display device according to one embodiment of the present invention. As is shown in FIG. 31, the pixel circuit 310C includes elements such as a transistor 800C, a storage capacitor 890C and a liquid crystal element 410C. The transistor 800C includes a first gate electrode 810C, a first source electrode 830C and a first drain electrode 840C. The first gate electrode 810C is connected to the gate wiring 331C. The first source electrode 830C is connected to the source wiring 321C. The first drain electrode 840C is connected to the storage capacitor 890C and the liquid crystal element 410C. The semiconductor devices 10 and 10A shown in the first embodiment and the second embodiment are applied to the transistor shown in FIG. 31. Furthermore, although 830C is referred to as a source electrode and 840C is referred to as a drain electrode in the present embodiment for the convenience of explanation, the function as the source and the function as the drain of each electrode may be interchanged.

Cross-Sectional Structure of Display Device 20C

FIG. 32 is a cross-sectional diagram of a display device according to one embodiment of the present invention. As is shown in FIG. 32, the display device 20C is a display device in which the transistors 800C and 900C which have different structures are arranged on the same substrate. The structure of the transistor 800C is different from the structure of the transistor 900C. Specifically, the transistor 800C is a bottom-gate type transistor in which the first oxide semiconductor layer 820C is used as a channel. The transistor 900C is a top-gate type transistor in which a semiconductor layer 920C is used as a channel. For example, the transistor 800C is used for the pixel circuit 310C, and the transistor 900C is used for the source driver circuit 320C and the gate driver circuit 330C. Furthermore, the transistor 900C may be used for the pixel circuit 310C.

The transistor 800C is a transistor formed above a substrate 301C, and a transistor having one or more insulating layers as base layers. In the present embodiment, insulating layers 340C, 342C, 344C, and 346C are used as base layers. A first gate electrode 810C is arranged on the insulating layer 346C. A first oxide semiconductor layer 820C is arranged above the first gate electrode 810C. The first gate electrode 810C faces the first oxide semiconductor layer 820C. An insulating layer 348C which functions as a gate insulating layer is arranged between the first gate electrode 810C and the first oxide semiconductor layer 820C. A first source electrode 830C is arranged at one end portion of a pattern of the first oxide semiconductor layer 820C, and a first drain electrode 840C is arranged at the other end portion of a pattern of the first oxide semiconductor layer 820C. The first source electrode 830C and the first drain electrode 840C are connected to the first oxide semiconductor layer 820C on the top surface and side surface of the first oxide semiconductor layer 820C, respectively.

First insulating layers 350C and 352C are arranged on the first oxide semiconductor layer 820C, the first source electrode 830C, and the first drain electrode 840C. Apertures 851C and 861C are arranged in the first insulating layers 350C and 352C. A first source wiring 850C is arranged on the first insulating layer 352C and inside the aperture 851C. A first drain wiring 860C is arranged on the first insulating layer 352C and inside the aperture 861C. An oxide layer 853C is arranged between the top surface of the first insulating layer 352C and the first source wiring 850C. An oxide layer 855C is arranged between the top surface of the first insulating layer 352C and the first drain wiring 860C.

A second insulating layer 354C is arranged on the first source wiring 850C and the first drain wiring 860C. A common electrode 880C which is arranged in common for a plurality of pixels is arranged on the second insulating layer 354C. A second insulating layer 356C is arranged on the common electrode 880C. A third aperture 871C is arranged in the second insulating layers 354C and 356C. A pixel electrode 870C is arranged on the second insulating layer 356C and inside the third aperture 871C. The pixel electrode 870C is connected to the first drain wiring 860C.

FIG. 33 is a plan view of a pixel electrode and a common electrode of a display device according to an embodiment of the present invention. As is shown in FIG. 33, the common electrode 880C has an overlapping region which overlaps the pixel electrode 870C in a plan view, and a non-overlapping region which does not overlap with the pixel electrode 870C. When a voltage is supplied between the pixel electrode 870C and the common electrode 880C, a horizontal electric field is formed from the pixel electrode 870C in the overlapping region toward the common electrode 880C in the non-overlapping region. The gradation of the pixel is determined by the operation of liquid crystal molecules which are included in the liquid crystal element 410C by the horizontal electric field.

In the structure described above, it is possible to apply the semiconductor devices 10 in FIG. 1 as the transistor 800C. In this case, when FIG. 1 is compared with FIG. 32, each member in each drawing corresponds as follows. The first gate electrode 110 corresponds to the first gate electrode 810C. The first gate insulating layer 120 corresponds to the insulating layer 348C. The first oxide semiconductor layer 130 corresponds to the first oxide semiconductor layer 820C. The first source electrode 141 corresponds to the first source electrode 830C. The first drain electrode 143 corresponds to the first drain electrode 840C. The first insulating layer 150 corresponds to the first insulating layers 350C and 352C. The first aperture 151 corresponds to the aperture 851C. The first aperture 153 corresponds to the aperture 861C. The oxide layer 160 corresponds to the oxide layers 853C and 855C. The first source wiring 171 corresponds to the first source wiring 850C. The first drain wiring 173 corresponds to the first drain wiring 860C.

The transistor 900C is a transistor which is formed in the substrate 301C, and the insulating layer 340C is used as a base layer. A light shielding layer 910C is arranged on the insulating layer 340C. The insulating layer 342C is arranged on the light shielding layer 910C. The semiconductor layer 920C is arranged on the insulating layer 342C. A second gate electrode 930C is arranged on the semiconductor layer 920C. The insulating layer 344C which functions as a gate insulating layer is arranged between the semiconductor layer 920C and the second gate electrode 930C. The insulating layers 346C, 348C, 350C, and 352C are arranged on the second gate electrode 930C. Apertures 941C and 951C are arranged in these insulating layers. A second source wiring 940C is arranged on the insulating layer 352C and inside the aperture 941C. A second drain wiring 950C is arranged on the insulating layer 352C and inside the aperture 951C. The insulating layer 354C is arranged on the second source wiring 940C and the second drain wiring 950C. In other words, the second gate electrode 930C is arranged under a layer (the insulating layer 348C) which is the same layer as the gate insulating layer of the transistor 800C.

Fourth Embodiment

A display device using a semiconductor device according to an embodiment of the present invention will be described with reference to FIG. 34 and FIG. 35. Furthermore, in the embodiment described below, a structure is explained in which the semiconductor device explained in the first embodiment and the second embodiment is applied to a circuit of an organic EL display device. Furthermore, since an outline and circuit structure of the display device 20D are the same as those shown in FIG. 29 and FIG. 30, an explanation is omitted.

Pixel Circuit 310D of Display Device 20D

FIG. 34 is a circuit diagram showing a pixel circuit of a display device according to an embodiment of the present invention. As is shown in FIG. 34, a pixel circuit 310D includes elements such as a drive transistor 960D, a selection transistor 970D, a storage capacitor 980D, and a light emitting element DO. A source electrode of the selection transistor 970D is connected to a signal line 971D, and a gate electrode of the selection transistor 970D is connected to a gate line 973D. A source electrode of the drive transistor 960D is connected to an anode power supply line 961D, and a drain electrode of the drive transistor 960D is connected to one end of the light emitting element DO. The other end of the light emitting element DO is connected to a cathode electrode 963D. A gate electrode of the drive transistor 960D is connected to the drain electrode of the selection transistor 970D. The storage capacitor 980D is connected to the gate electrode and the drain electrode of the drive transistor 960D. A gradation signal for determining the light emitting intensity of the light emitting element DO is supplied to the signal line 971D. A signal for selecting a pixel row in which the gradation signal described above is written is supplied to the gate line 973D.

Cross-Sectional Structure of Display Device 20D

FIG. 35 is a cross-sectional diagram of a display device according to one embodiment of the present invention. Although the structure of the display device 20C shown in FIG. 35 is similar to the display device 20C shown in FIG. 32, the structure above an insulating layer 354D of the display device 20D is different from the structure above the insulating layer 354C of the display device 20C. Hereinafter, in the structure of the display device 20D shown in FIG. 35, an explanation of the same structure as the display device 20C shown in FIG. 32 is omitted, and differences from the display device 20C are explained.

As is shown in FIG. 35, the display device 20D includes a pixel electrode 981D, a light emitting layer 983D, and a common electrode 985D above the insulating layer 354D. The pixel electrode 981D is arranged on the insulating layer 354D and inside a third aperture 871D. An insulating layer

358D is arranged on the pixel electrode 981D. An aperture 359D is arranged in the insulating layer 358D. The aperture 359D corresponds to a light emitting region. That is, the insulating layer 358D defines a pixel. The light emitting layer 983D and the common electrode 985D are arranged on the pixel electrode 981D exposed through the aperture 359D. The pixel electrode 981D and the light emitting layer 983D are separately arranged for each pixel. On the other hand, the common electrode 985D is arranged in common for a plurality of pixels. Different materials are used for the light emitting layer 983D depending on the display color of the pixel.

In the third embodiment and fourth embodiment, although a structure was exemplified in which the semiconductor device explained in the first embodiment and the second embodiment were applied to a liquid crystal display device and an organic EL display device, displays other than these display devices (for example, a self-luminous display device or an electronic paper display device other than an organic EL display device) may also be applied with the semiconductor device. In addition, the semiconductor device described above can be applied without any particular limitation from a small sized display device to a large sized display device.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A semiconductor device comprising:
an oxide semiconductor layer including a first surface and a second surface opposite to the first surface;
a gate electrode facing the oxide semiconductor layer;
a gate insulating layer between the oxide semiconductor layer and the gate electrode; and
a pair of first electrode being in contact with the first surface of the oxide semiconductor layer, respectively,
wherein the oxide semiconductor layer including a region in which composition ratio of nitrogen is 2 percent or more within a depth range of 2 nanometers from the first surface in a region vicinity of an edge of at least one of the first electrode of the pair of first electrode, and
indium in the oxide semiconductor layer is unevenly distributed in a region overlapping the first electrode in a plan view.

2. The semiconductor device according to claim 1,
further comprising a insulating layer,
wherein the insulating layer covers the first surface of the oxide semiconductor layer sandwiched by the pair of first electrode.

3. The semiconductor device according to claim 1,
wherein the oxide semiconductor layer includes a region in which composition ratio of nitrogen is 6 percent or more within a depth range of 2 nanometers from the first surface in a region vicinity of an edge of at least one of the first electrode of the pair of first electrode.

4. The semiconductor device according to claim 1,
wherein the composition ratio of nitrogen is measured by using an Energy Dispersive X-ray spectrometry (EDX) arranged in a Scanning Transmission Electron Microscope (STEM).

5. The semiconductor device according to claim 1, further comprising:
an oxide portion formed on an end portion of the first electrode above the oxide semiconductor layer, the oxide portion including an oxide of the first electrode,
wherein the first electrode is in contact with the oxide semiconductor layer from above the oxide semiconductor layer.

6. The semiconductor device according to claim 5,
wherein a degree of unevenly distribution of indium in a region overlapping the oxide portion in a plan view is smaller than a degree of unevenly distribution of indium in a region overlapping the first electrode in a plan view.

7. The semiconductor device according to claim 6,
wherein indium is not unevenly distributed in the region overlapping the oxide portion in a plan view.

8. The semiconductor device according to claim 5,
wherein the oxide portion has a conductive property.

9. The semiconductor device according to claim 5 further comprising:
a second electrode arranged above the first electrode,
wherein the oxide portion is located closer to a channel region in the semiconductor device than an end portion of the second electrode.

10. The semiconductor device according to claim 1,
wherein the gate electrode and the gate insulating layer are arranged below the oxide semiconductor layer.

* * * * *